US011043495B2

(12) United States Patent
Lee et al.

(10) Patent No.: US 11,043,495 B2
(45) Date of Patent: Jun. 22, 2021

(54) INTEGRATED CIRCUIT SEMICONDUCTOR DEVICE AND METHOD OF MANUFACTURING THE SAME

(71) Applicant: Samsung Electronics Co., Ltd., Suwon-si (KR)

(72) Inventors: Jaehyun Lee, Hwaseong-si (KR); Jonghan Lee, Namyangju-si (KR); Seonghwa Park, Seoul (KR); Jongha Park, Suwon-si (KR); Jaehoon Woo, Hwaseong-si (KR); Dabok Jeong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/718,799

(22) Filed: Dec. 18, 2019

(65) Prior Publication Data
US 2020/0381432 A1    Dec. 3, 2020

(30) Foreign Application Priority Data
May 29, 2019    (KR) ........................ 10-2019-0063305

(51) Int. Cl.
*H01L 27/092*    (2006.01)
*H01L 29/06*    (2006.01)
(Continued)

(52) U.S. Cl.
CPC .. *H01L 27/0924* (2013.01); *H01L 21/823807* (2013.01); *H01L 21/823821* (2013.01);
(Continued)

(58) Field of Classification Search
CPC . H01L 27/0924; H01L 27/092; H01L 27/088; H01L 29/0673; H01L 29/0649; H01L 29/785; H01L 29/66795; H01L 29/42392; H01L 20/78696; H01L 21/823878; H01L 21/823807; H01L 21/823821; H01L 21/823857; H01L 21/823431
USPC .......... 257/369, 347, 368, 401, 623, E27.06, 257/E27.112, E29.085, E29.255, E29.277, 257/E21.09, E21.415, E21.444, E21.703; 438/596, 270, 283, 151, 157
See application file for complete search history.

(56) References Cited

U.S. PATENT DOCUMENTS 9,006,087 B2    4/2015    Chang et al.
9,899,271 B2    2/2018    Chang et al.
(Continued)

*Primary Examiner* — Dao H Nguyen
(74) *Attorney, Agent, or Firm* — Myers Bigel, P.A.

(57) ABSTRACT

An integrated circuit semiconductor device includes a first region including a first transistor and a second region in contact with the first region in a second direction. The first transistor includes a first active fin extending in a first direction, a first gate dielectric layer extending from the first active fin onto a first isolation layer in the second direction, and a first gate electrode on the first gate dielectric layer. The second region includes a second transistor including a second active fin extending in the first direction, a second gate dielectric layer extending from the second active fin onto a second isolation layer in the second direction, and a second gate electrode on the second gate dielectric layer. The integrated circuit semiconductor device includes a gate dielectric layer removal region proximate a boundary between the first region and the second region.

20 Claims, 26 Drawing Sheets

(51) Int. Cl.
*H01L 21/8238* (2006.01)
*H01L 29/66* (2006.01)
*H01L 29/78* (2006.01)

(52) U.S. Cl.
CPC .. *H01L 21/823878* (2013.01); *H01L 29/0649* (2013.01); *H01L 29/0673* (2013.01); *H01L 29/66795* (2013.01); *H01L 29/785* (2013.01)

(56) References Cited

U.S. PATENT DOCUMENTS

| | | | |
|---|---|---|---|
| 9,935,112 B1 | 4/2018 | Zang et al. | |
| 10,079,289 B2 | 9/2018 | Lee et al. | |
| 10,103,065 B1 | 10/2018 | Mochizuki et al. | |
| 10,153,209 B1 | 12/2018 | Xu et al. | |
| 10,461,171 B2 * | 10/2019 | Hsiao | H01L 29/0649 |
| 2015/0228647 A1 * | 8/2015 | Chang | H01L 21/823431 257/401 |
| 2017/0141227 A1 * | 5/2017 | Jacob | H01L 29/165 |
| 2018/0138046 A1 * | 5/2018 | Bentley | H01L 29/42392 |
| 2018/0315667 A1 | 11/2018 | Kwon et al. | |
| 2018/0342427 A1 | 11/2018 | Xie et al. | |
| 2019/0363084 A1 | 11/2019 | Jo et al. | |
| 2020/0006356 A1 * | 1/2020 | Ando | H01L 27/0924 |
| 2020/0091145 A1 * | 3/2020 | Guha | H01L 29/78696 |

\* cited by examiner

INTEGRATED CIRCUIT SEMICONDUCTOR DEVICE AND METHOD OF MANUFACTURING THE SAME

CROSS-REFERENCE TO RELATED APPLICATION

This application claims the benefit of Korean Patent Application No. 10-2019-0063305, filed on May 29, 2019, in the Korean Intellectual Property Office, the disclosure of which is incorporated herein in its entirety by reference.

BACKGROUND

The inventive concepts relate to an integrated circuit semiconductor device and a method of manufacturing the same, and more particularly, to an integrated circuit semiconductor device including transistors and a method of manufacturing the integrated circuit semiconductor device.

To meet the consumer demand for integrated semiconductor devices with excellent performance, transistors should be reliably formed on in integrated semiconductor devices. However, as the integrated circuit semiconductor devices have become more highly integrated, when such integrated circuit semiconductor devices include three-dimensional transistors instead of planar transistors, it may be difficult to reliably form three-dimensional transistors on a substrate.

SUMMARY

The inventive concepts provide an integrated circuit semiconductor device including three-dimensional transistors that are reliably formed.

The inventive concepts provide a method of manufacturing the above-described integrated circuit semiconductor device.

According to an aspect of the inventive concepts, there is provided an integrated circuit semiconductor device including: a first region including a first transistor, wherein the first transistor includes a first active fin extending in a first direction, a first gate dielectric layer extending from the first active fin onto a first isolation layer in a second direction perpendicular to the first direction, and a first gate electrode formed on the first gate dielectric layer; a second region disposed in contact with the first region in the second direction, wherein the second region includes a second transistor, the second transistor including a second active fin extending in the first direction, a second gate dielectric layer extending from the second active fin onto a second isolation layer in the second direction, and a second gate electrode formed on the second gate dielectric layer; and a gate dielectric layer removal region located in a vicinity of or proximate a boundary between the first region and the second region, wherein the gate dielectric layer removal region is disposed to be shifted to or is offset toward either the first region or the second region in the second direction with respect to the boundary, or is disposed in any one of the first region or the second region.

According to an aspect of the inventive concepts, there is provided an integrated circuit semiconductor device including: a first region including a first multi-bridge channel type transistor, wherein the first multi-bridge channel type transistor includes a first active fin protruding from a substrate and extending in a first direction, a first gate dielectric layer extending from the first active fin onto a first isolation layer in a second direction perpendicular to the first direction, a plurality of first nanosheets stacked apart from the first gate dielectric layer, a third gate dielectric layer surrounding the first nanosheets, and a first gate electrode formed on the first gate dielectric layer and the third gate dielectric layer and formed between the first nanosheets; a second region formed adjacent to the first region in the second direction, wherein the second region includes a second multi-bridge channel type transistor, the second multi-bridge channel type transistor including a second active fin protruding from the substrate and extending in the first direction, a second gate dielectric layer extending from the second active fin onto a second isolation layer in the second direction perpendicular to the first direction, a plurality of second nanosheets stacked apart from the second gate dielectric layer, a fourth gate dielectric layer surrounding the second nanosheets, and a second gate electrode formed on the second gate dielectric layer and the fourth gate dielectric layer and formed between the second nanosheets; and a gate dielectric layer removal region located on the substrate in a vicinity of or proximate a boundary between the first region and the second region, wherein the gate dielectric layer removal region is disposed to be shifted to or is offset toward either the first region or the second region in the second direction with respect to the boundary, or is disposed in any one of the first region or the second region.

According to an aspect of the inventive concepts, there is provided an integrated circuit semiconductor device including: a first region including a first fin type transistor, wherein the first fin type transistor includes a first active fin protruding from a substrate and extending in a first direction, a first gate dielectric layer extending from the first active fin onto a first isolation layer in a second direction perpendicular to the first direction, and a first gate electrode formed on the first gate dielectric layer; a second region disposed in contact with the first region in the second direction, wherein the second region includes a second fin type transistor, the second fin type transistor including a second active fin protruding from the substrate and extending in the first direction, a second gate dielectric layer extending from the second active fin onto a second isolation layer in the second direction, and a second gate electrode formed on the second gate dielectric layer; and a gate dielectric layer removal region located in a vicinity of or proximate a boundary between the first region and the second region, wherein the gate dielectric layer removal region is disposed to be shifted to or is offset toward either the first region or the second region in the second direction with respect to the boundary, or is disposed in any one of the first region or the second region.

According to an aspect of the inventive concepts, there is provided a method of manufacturing an integrated circuit semiconductor device, the method including: forming a first active fin defined by a first isolation layer and extending in a first direction in a first region; forming a second active fin defined by a second isolation layer and extending in the first direction in a second region, the second region being adjacent to the first region in a second direction perpendicular to the first direction; forming a first gate dielectric layer on the first active fin and the first isolation layer of the first region; forming a second gate dielectric layer on the second active fin and the second isolation layer of the second region; and forming a gate dielectric layer removal region in the vicinity of or proximate a boundary between the first region and the second region, wherein the gate dielectric layer removal region is disposed to be shifted to or is offset toward either the first region or the second region in the second direction with respect to the boundary, or is disposed in any one of the first region or the second region.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings. The following embodiments of the inventive concepts may be implemented by any one of the embodiments, or may be implemented by combining one or more of the embodiments. Accordingly, the inventive concepts are not to be interpreted as being limited to any one embodiment.

Figure 1:
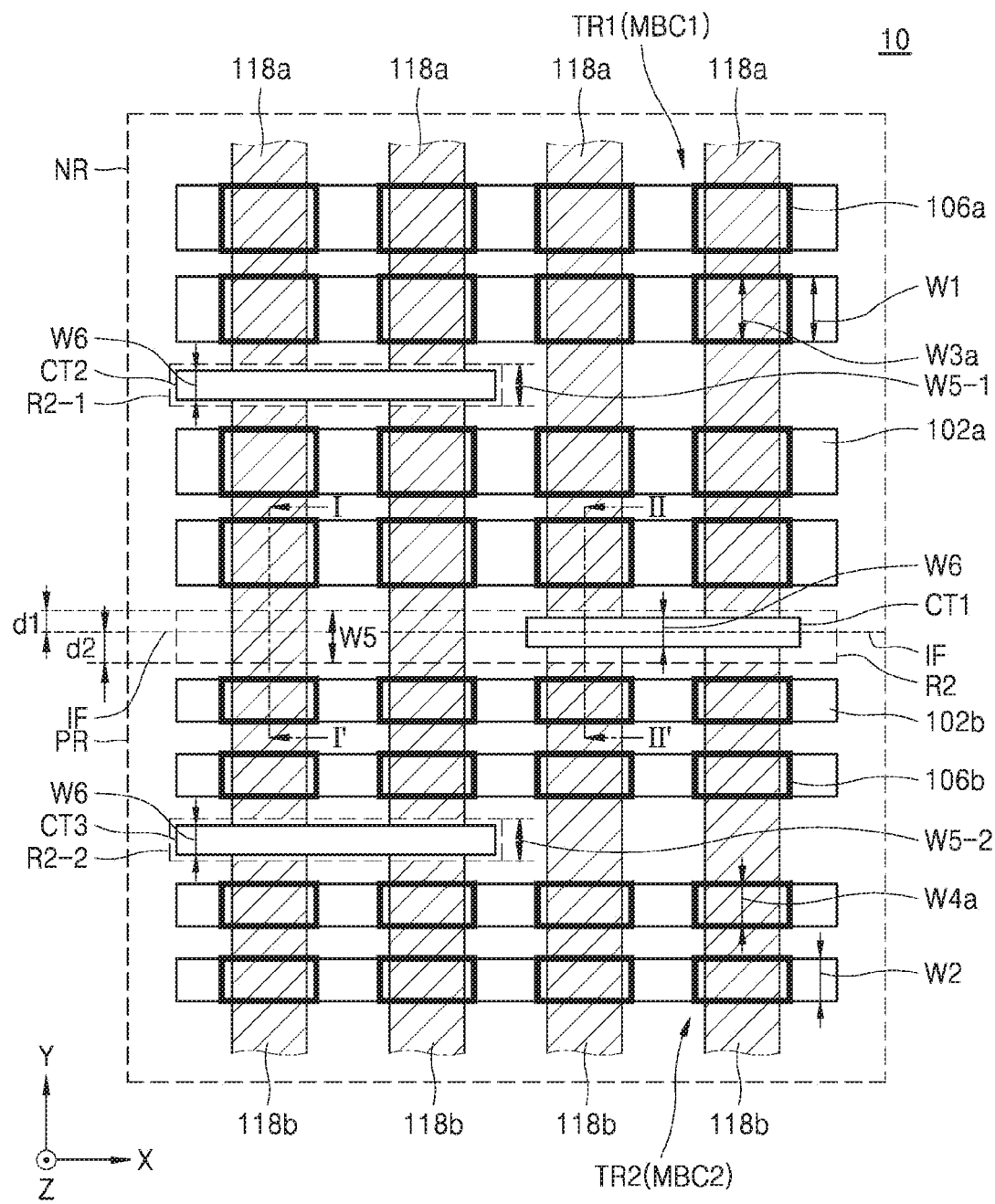
FIG. 1 is a layout diagram of an integrated circuit semiconductor device according to some embodiments of the inventive concepts.

FIG. 1 is a layout diagram of an integrated circuit semiconductor device according to some embodiments of the inventive concepts.

Specifically, the integrated circuit semiconductor device 10 may include a logic cell region. The logic cell region may include a plurality of cell transistors having high performance, for example, metal-oxide-semiconductor (MOS) transistors. The cell transistors may include multi-bridge channel type transistors.

The integrated circuit semiconductor device 10 may include a first region NR and a second region PR. In some embodiments, the first region NR may be a region where a plurality of first transistors TR1, for example, a plurality of first multi-bridge channel type transistors MBC1, are formed. The first multi-bridge channel type transistors MBC1 may include an N-type transistor, for example, an N-type MOS transistor. The terms first, second, etc. may be used herein to distinguish one element from another element, but these elements should not be limited by these terms.

In some embodiments, the second region PR may be a region where a plurality of second transistors TR2, for example, a plurality of second multi-bridge channel type transistors MBC2, are formed. The second multi-bridge channel type transistors MBC2 may include a P-type transistor, for example, a P-type MOS transistor.

In FIG. 1, a first direction (an X direction) may be a direction of a channel length, and a second direction (a Y direction) may be a direction of a channel width. The first transistors TR1 of the first region NR may include at least one active fin 102a and the second transistors TR2 of the second region PR may include at least one active fin 102b. In some embodiments, the first transistor TR1 of the first region NR may include two active fins 102a and the second transistor TR2 of the second region PR may include two active fins 102b.

Hereinafter, the channel width will be described, for example, based on a case where the first transistors TR1 and the second transistors TR2 include one active fin 102a and 102b, respectively. Hereinafter, a layout of the integrated circuit semiconductor device 10 will be described in more detail, and the inventive concepts are not limited to the layout shown in FIG. 1.

The integrated circuit semiconductor device 10 may include a plurality of first active fins 102a and a plurality of second active fins 102b extending in the first direction. A first width of the first active fins 102a, i.e., the first width in the second direction, may be W1. A second width of the second active fins 102b, i.e., the second width in the second direction, may be W2 which is different from the first width W1. In some embodiments, the first width W1 may be greater than the second width W2.

The first active fins 102a and the second active fins 102b may be each formed in the first region NR and the second region PR, respectively. The first active fins 102a located in the first region NR may be provided as an active region of the first transistor TR1. The second active fins 102b located in the second region PR may be provided as an active region of the second transistor TR2.

An isolation layer may be provided between the first active fins 102a and between the second active fins 102b. The integrated circuit semiconductor device 10 may include a plurality of first gate electrodes 118a and a plurality of second gate electrodes 118b each extending in the second direction perpendicular to the first direction to which the first active fins 102a and the second active fins 102b extend.

A plurality of first nanosheets 106a may be stacked in a region where the first active fins 102a and the first gate electrodes 118a intersect in the first region NR. A plurality of second nanosheets 106b may be stacked in a region where the second active fins 102b and the second gate electrodes 118b intersect in the second region PR.

The first nanosheets 106a and the second nanosheets 106b may each include four nanosheets in this embodiment, but the inventive concepts are not limited thereto. For example, the first nanosheets 106a and the second nanosheets 106b may each include at least one nanosheet.

Although cross-sections of the first nanosheets 106a and the second nanosheets 106b are illustrated as a rectangular shape in this embodiment, the first nanosheets 106a and the second nanosheets 106b may have a circular shape and may be referred to as nanowires.

A width (in the second direction) of the first nanosheets 106a that constitute the first transistors TR1 in the first region NR may be W3a. A width (in the second direction) of the second nanosheets 106b that constitute the second transistors TR2 in the second region PR may be W4a, wherein W4a is different from W3a and may be less than W3a.

Accordingly, since the width W3a of the first nanosheets 106a is different from the width W4a of the second nanosheets 106b, a first channel width of the first transistor TR1 and a second channel width of the second transistor TR2 may be different. In some embodiments, the first channel width of the first transistor TR1 may be greater than the second channel width of the second transistor TR2.

The first region NR and the second region PR may be adjacent or in contact with each other in the second direction (the Y direction) in the layout diagram. That is, the second region PR may be located below and/or above the first region NR. In some embodiments, the first region NR and the second region PR may be alternately and repeatedly arranged in the second direction (the Y direction), such that a respective first region NR may be immediately adjacent a respective second region PR. As used herein, when an element or region is "directly on" or "directly contacts" or is "immediately adjacent" another element or region, no intervening elements are present.

As described above, the plurality of first transistors TR1 may be formed in the second direction in the first region NR. The plurality of second transistors TR2 may be formed in the second direction in the second region PR. Source/drain regions (not shown) may be formed in the first and second active fins 102a and 102b on both sides of the first and second nanosheets 106a and 106b and the first and second gate electrodes 118a and 118b in the first direction.

A boundary, for example a boundary line IF, extending in the first direction (the X direction) may be defined at an interface between the first region NR and the second region PR. The boundary line IF may be a metal gate boundary line. Threshold voltages of the first transistors TR1 of the first region NR and threshold voltages of the second transistors TR2 of the second region PR may deviate from designed values depending on distances apart from the boundary line IF.

It is considered that since impurities contained in a metal layer may diffuse into a gate dielectric layer located near the boundary line IF, the threshold voltages of the first transistors TR1 and the second transistors TR2 may deviate from the designed values, and therefore it may be referred to as a metal gate boundary effect. In order to reduce or prevent the metal gate boundary effect, according to the inventive concepts, a first gate dielectric layer removal region R2 where a gate dielectric layer is removed may be located in the vicinity of or proximate the boundary line IF of the first region NR and the second region PR.

As used herein, a gate dielectric layer removal region may refer to a region in which portions of a gate dielectric layer have been removed or is otherwise substantially free of a gate dielectric layer, for example, a region separating a first and a second gate dielectric layers (of adjacent first and second transistors). For example, portions of a gate dielectric layer may be removed to define a first gate dielectric layer and a second gate dielectric layer, which are separated by the gate dielectric layer removal region therebetween.

The first gate dielectric layer removal region R2 may be disposed to be shifted to either the first region NR or the second region PR in the second direction with respect to the boundary line IF. In other words, the first gate dielectric layer removal region R2 may be offset from the boundary line IF towards the first region NR or towards the second region PR. The first gate dielectric layer removal region R2 may have different distances from the boundary line IF toward the first region NR and the second region PR in the second direction. Accordingly, the threshold voltages of the first transistors TR1 and the second transistors TR2 located in the first region NR and the second region PR may be reduced or prevented from deviating from the designed values.

In some embodiments, a width of the first gate dielectric layer removal region R2 in the second direction may be W5. Opposing boundaries of the first gate dielectric layer removal region R2 may have distances d1 and d2 from the boundary line IF toward the first region NR and the second region PR, respectively, in the second direction.

In the first gate dielectric layer removal region R2, a first gate cut region CT1 where the first and second gate electrodes 118a and 118b are separated or broken in the second direction may be located. The first gate cut region CT1 may be more easily formed in the first gate dielectric layer removal region R2. In some embodiments, a width of the first gate cut region CT1 in the second direction may be W6 which is less than W5.

In some embodiments, a second gate dielectric layer removal region R2-1 may be located in the first region NR. In some embodiments, a width of the second gate dielectric layer removal region R2-1 in the second direction may be W5-1. In some embodiments, the width W5-1 of the second gate dielectric layer removal region R2-1 may be equal to or less than the width W5 of the first gate dielectric layer removal region R2.

A second gate cut region CT2 where the first gate electrode 118a is separated or broken may be disposed in the second gate dielectric layer removal region R2-1 of the first region NR. In some embodiments, a width of the second gate cut region CT2 in the second direction may be W6, equal to the width of the first gate cut region CT1. A second gate cut pattern defining the second gate cut region CT2 may include an insulating layer, for example, a silicon nitride layer.

In some embodiments, the second gate cut region CT2 in the first region NR may have a shape that extends in whole or in part in the first direction. In some embodiments, the second gate cut region CT2 may be a region that cuts or separates two first gate electrodes 118a or four first gate electrodes 118a in.

In some embodiments, a third gate dielectric layer removal region R2-2 may be located in the second region PR. In some embodiments, the width of the third gate dielectric layer removal region R2-2 in the second direction may be W5-2. In some embodiments, the width W5-2 of the third gate dielectric layer removal region R2-2 may be equal to or less than the width W5 of the first gate dielectric layer removal region R2.

A third gate cut region CT3 where the second gate electrode 118b is separated or broken may be disposed in the second region PR. In some embodiments, a width of the third gate cut region CT3 in the second direction may be W6, like the widths of the first gate cut region CT1 and the second gate cut region CT2.

In some embodiments, the third gate cut region CT3 in the second region PR may have a shape fully or partially extending in the first direction. In some embodiments, the third gate cut region CT3 may be a region that cuts or separates two second gate electrodes 118b or four second gate electrodes 118b.

Figure 2:
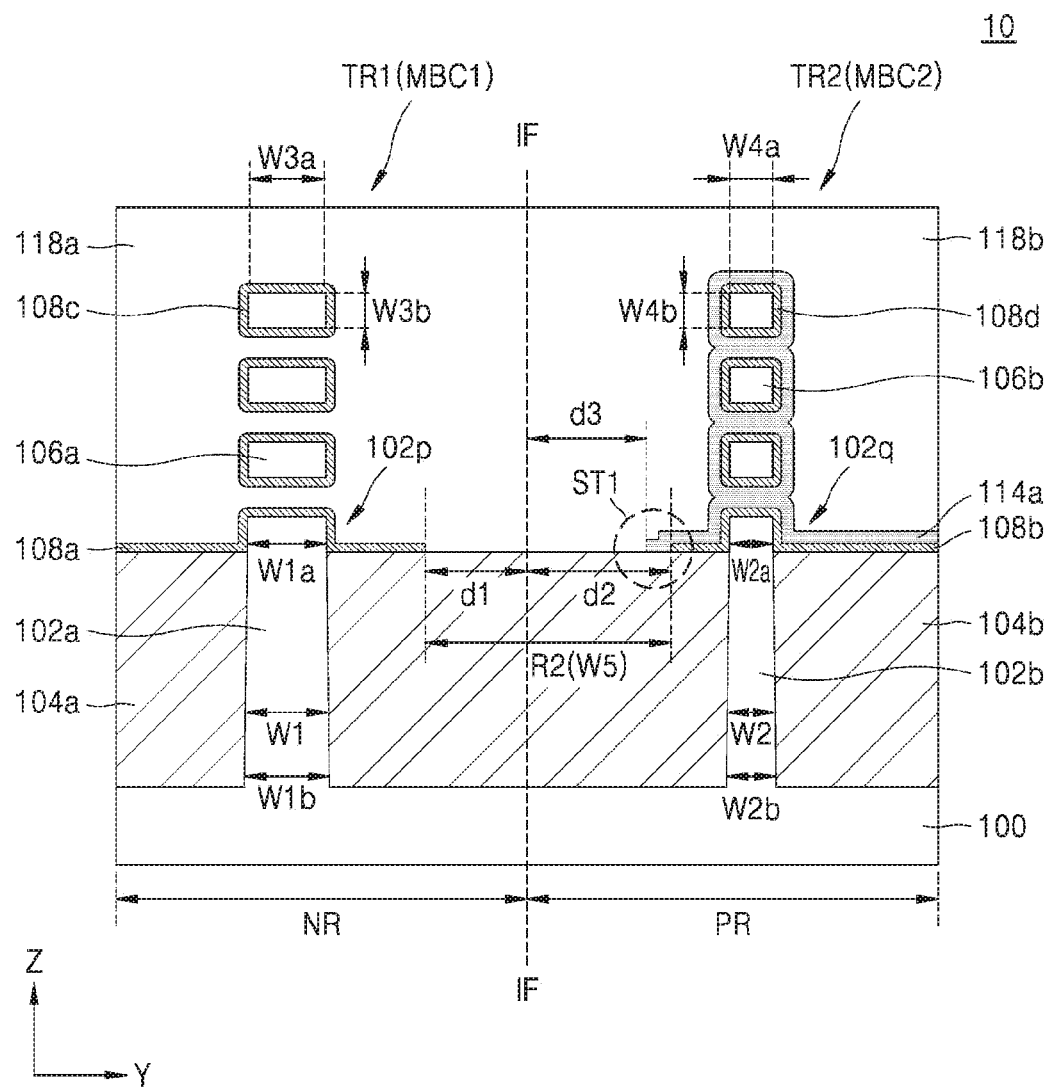
FIG. 2 is a cross-sectional view taken along line I-I' of the integrated circuit semiconductor device of FIG. 1.

FIG. 2 is a cross-sectional view taken along line I-I' of the integrated circuit semiconductor device of FIG. 1.

Specifically, the integrated circuit semiconductor device 10 may include the first transistor TR1 and the second transistor TR2 in the first region NR and the second region PR of the substrate 100, respectively. The first transistor TR1 and the second transistor TR2 may each include a first multi-bridge channel type transistor MBC1 and a second multi-bridge channel type transistor MBC2. The integrated circuit semiconductor device 10 may include the first active fin 102a and the second active fin 102b protruding from the substrate 100 in a third direction (a Z direction).

The substrate 100 may include a semiconductor material such as silicon, germanium, silicon-germanium, and the like or a Group III-V semiconductor compound such as GaP, GaAs, GaSb, and the like. In some embodiments, the substrate 100 may include a silicon-on-insulator (SOI) substrate or a germanium-on-insulator (GOI) substrate.

The first active fin 102a and the second active fin 102b may extend in the first direction (the X direction) as described above. The first active fin 102a and the second active fin 102b may have different widths in a second direction (the Y direction), i.e., the widths of W1 and W2.

In some embodiments, a first width W1 of the first active fin 102a may be greater than a second width W2 of the second active fin 102b in the second direction. In some embodiments, an upper width W1a of the first active fin 102a may be less than a lower width W1b thereof. An upper width W2a of the second active fin 102b may be less than a lower width W2b thereof.

A first isolation layer 104a and a second isolation layer 104b may be formed on a portion of the substrate 100 except for the portion of the substrate 100, on which the first active fin 102a and the second active fin 102b are formed. The first isolation layer 104a and the second isolation layer 104b may include a silicon oxide film, a silicon nitride film, or a combination thereof. The first isolation layer 104a and the second isolation layer 104b may be formed around the first active fin 102a and the second active fin 102b, respectively.

In some embodiments, the first active fin 102a and the second active fin 102b may include a first fin protrusion portion 102p and a second fin protrusion portion 102q which protrude from surfaces of the first isolation layer 104a and the second isolation layer 104b, respectively. The first fin protrusion portion 102p and the second fin protrusion portion 102q may not be formed in some embodiments.

In the first region NR, a first gate dielectric layer 108a may extend from the first active fin 102a and the first fin protrusion portion 102p onto the first isolation layer 104a in the second direction (the Y direction). The first gate dielectric layer 108a may be formed on an upper surface and a side surface of the first fin protrusion portion 102p and formed on a part of an upper surface of the first isolation layer 104a.

A plurality of first nanosheets 106a may be stacked on the first gate dielectric layer 108a to be spaced apart from one another and a third gate dielectric layer 108c may be formed to surround the first nanosheets 106a. A width and a height of the first nanosheets 106a in the first region NR may each be W3a and W3b. The first gate electrode 118a may be formed on the first gate dielectric layer 108a and the third gate dielectric layer 108c and between the first nanosheets 106a. In other words, the first gate electrode 118a may be formed on the first gate dielectric layer 108a and the third gate dielectric layer 108c surrounding the first nanosheets 106a.

In the second region PR, the second gate dielectric layer 108b may extend from the second active fin 102b and the second fin protrusion portion 102q onto the second isolation layer 104b in the second direction (the Y direction). The second gate dielectric layer 108b may be formed on an upper surface and a side surface of the second fin protrusion portion 102q and formed on a part of an upper surface of the second isolation layer 104b.

A plurality of second nanosheets 106b may be stacked on the second gate dielectric layer 108b to be apart from one another and a fourth gate dielectric layer 108d may be formed to surround the second nanosheets 106b. A width and a height of the second nanosheets 106b in the second region PR may each be W4a and W4b.

A first channel width (in the second direction) of the first transistors TR1 in the first region NR may be determined based on the width W3a and the height W3b of the first nanosheets 106a and the number of the stacked first nanosheets 106a. That is, the first channel width may be (W3a+2×W3b)×4.

A second channel width (in the second direction) of the second transistors TR2 in the second region PR may be determined based on the width W4a and the height W4b of the second nanosheets 106b and the number of the stacked second nanosheets 106b. That is, the second channel width may be (W4a+2×W4b)×4.

In some embodiments, when the width W3a of the first nanosheets 106a is different from the width W4a of the second nanosheets 106b, the first channel width and the second channel width may be different. In some embodiments, when the width W3a of the first nanosheets 106a is greater than the width W4a of the second nanosheets 106b, the first channel width may be greater than the second channel width.

In some embodiments, a threshold voltage adjustment layer 114a may be formed on surfaces of the second gate dielectric layer 108b and the fourth gate dielectric layer 108d and between the second nanosheets 106b, as needed or desired for threshold voltage adjustment. The threshold voltage adjustment layer 114a may include a metal material having a work function that matches the threshold voltage characteristics of the second transistor TR2, for example, a P-type transistor. In some embodiments, the threshold voltage adjustment layer 114a may include, for example, Ti, TiN, Ta, TaN, and the like.

A second gate electrode 118b may be formed on the threshold voltage adjustment layer 114a. When the threshold voltage adjustment layer 114a is not formed, the second gate electrode 118b may be formed on the surfaces of the second gate dielectric layer 108b and the fourth gate dielectric layer 108d and formed between the second nanosheets 106b. The first gate electrode 118a and the second gate electrode 118b may be connected to each other. In the integrated circuit semiconductor device 10, an interlayer insulating film may be formed except regions where the first gate electrode 118a and the second gate electrode 118b are formed.

In some embodiments, the first to fourth gate dielectric layers 108a to 108d may include high dielectric constant dielectric layers having a higher dielectric constant than a silicon oxide layer. For example, the first to fourth gate dielectric layers 108a to 108d may include at least one material selected from hafnium oxide (HfO2), hafnium silicate (HfSiO), hafnium oxynitride (HfON), hafnium silicon oxynitride (HfSiON), hafnium aluminum oxide (HfAlO3), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide (TiO2), barium strontium titanium oxide (BaSrTiO), barium titanium oxide (BaTiO), strontium titanium oxide (SrTiO), yttrium oxide (YO), aluminum oxide (Al2O3), tantalum oxide (Ta2O3), or lead scandium tantalum oxide (PbScTaO).

In some embodiments, the first gate electrode 118a and the second gate electrode 118b may include metal or metal nitride. According to an example embodiment, the first gate electrode 118a and the second gate electrode 118b may include Ti, TiN, Ta, TaN, TiAlC, TiAlCN, TiAlSiCN, Co, W, and the like.

In the vicinity of the boundary line IF between the first region NR and the second region PR, the first gate dielectric layer removal region R2 from which a gate dielectric layer is removed may be located. The width of the first gate dielectric layer removal region R2 in the second direction may be W5. The first gate dielectric layer 108a and the second gate dielectric layer 108b may be partially removed at portions of the first isolation layer 104a and the second isolation layer 104b, the portions being near or proximate the boundary line IF of the first region NR and the second region PR.

The above-described metal gate boundary effect may be reduced or prevented by forming the first gate dielectric layer removal region R2. The first gate dielectric layer removal region R2 may be disposed to be shifted to or offset toward either the first region NR or the second region PR in the second direction (the Y direction) with respect to the boundary line IF as described above.

In some embodiments, a distance d1 from the boundary line IF to an edge of the first gate dielectric layer 108a may be different from a distance d2 from the boundary line IF to an edge of the second gate dielectric layer 108b in the first gate dielectric layer removal region R2. In some embodiments, in the first gate dielectric layer removal region R2, the distance d1 from the boundary line IF to the edge of the first gate dielectric layer 108a may be less than the distance d2 from the boundary line IF to the edge of the second gate dielectric layer 108b.

The threshold voltage adjustment layer 114a may be formed on one side of the first gate dielectric layer removal region R2 to extend along or cover the second gate dielectric layer 108b. The threshold voltage adjustment layer 114a may not be connected to the first gate dielectric layer 108a. Due to the threshold voltage adjustment layer 114a, a first step portion ST1 may be formed in one side of the first gate dielectric layer removal region R2 of the second region PR. A distance from the boundary line IF to the threshold voltage adjustment layer 114a in the second region PR may be d3, which is less than d2.

Figure 3:
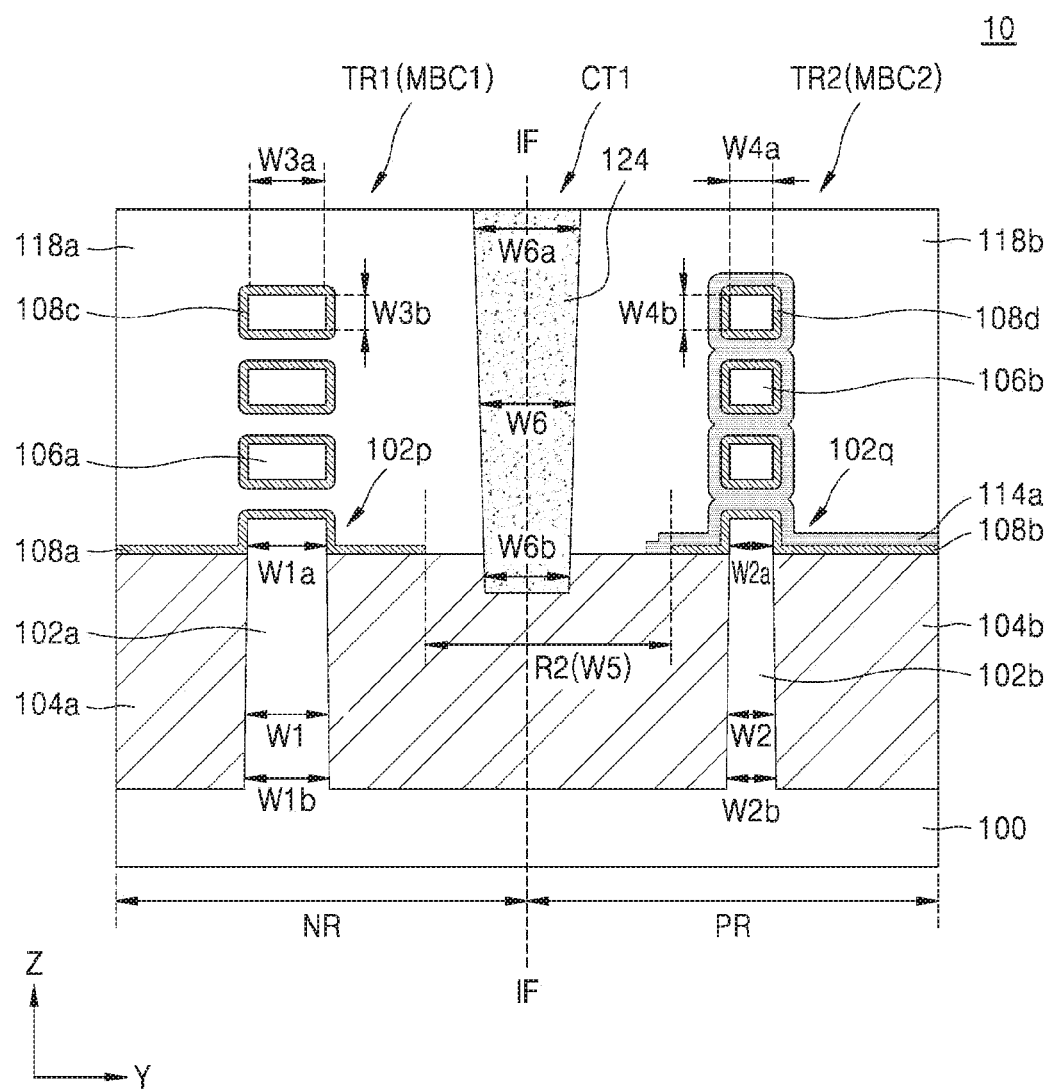
FIG. 3 is a cross-sectional view taken along line II-II' of the integrated circuit semiconductor device of FIG. 1.

FIG. 3 is a cross-sectional view taken along line II-II' of the integrated circuit semiconductor device 10 of FIG. 1.

Specifically, the same reference numerals in FIGS. 2 and 3 denote the same elements. The integrated circuit semiconductor device 10 of FIG. 3 may further include a first gate cut region CT1. The first gate cut region CT1 may be a region for cutting the first and second gate electrodes 118a and 118b in the first gate dielectric layer removal region R2.

The first gate cut region CT1 may be more easily formed because the first gate cut region CT1 is formed over the first gate dielectric layer removal region R2. In addition, since a gate dielectric layer is not formed in the first gate dielectric layer removal region R2, a gate electrode material may be more easily etched. In some embodiments, a width of the first gate cut region CT1 in the second direction may be W6. The first gate electrode 118a and the second gate electrode 118b may be separated from each other due to the first gate cut region CT1.

In some embodiments, a gate cut pattern 124 that defines the first gate cut region CT1 may include an insulating layer, for example, a silicon nitride layer. In some embodiments, one side wall of the gate cut pattern 124 defining the first gate cut region CT1 may be inclined in the third direction (the Z direction) perpendicular to a plane defined by the first direction and the second direction. In other words, one side wall of the gate cutting pattern 124 may be inclined from a surface of the first gate electrode 118a and the second gate electrode 118b toward a bottom thereof.

In some embodiments, a lower width W6b of the gate cut pattern 124 may be less than an upper width W6a thereof. The bottom of the gate cutting pattern 124 may be located below upper surfaces of the isolation layers 104a and 104b.

Figure 4:
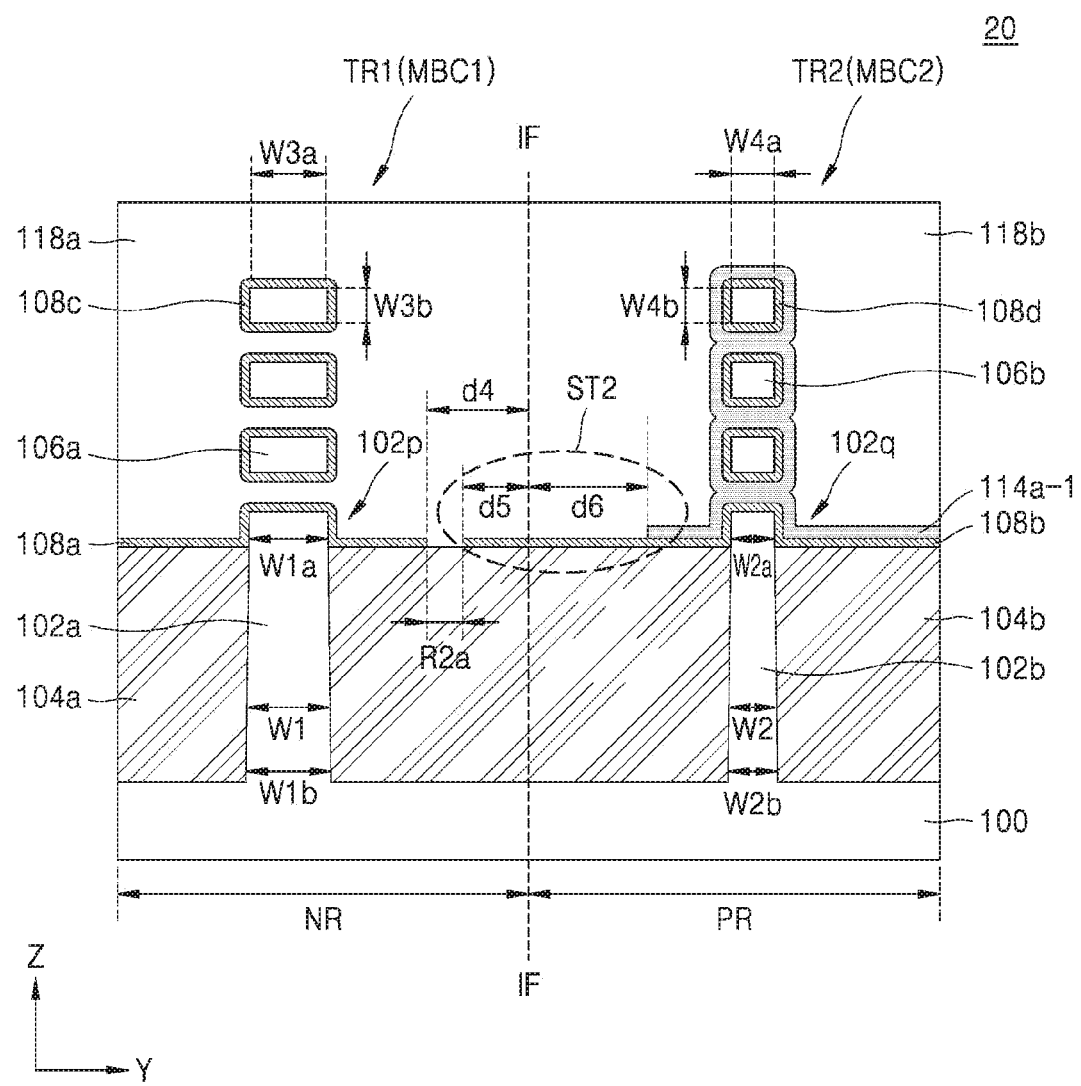
FIG. 4 is a cross-sectional view of an integrated circuit semiconductor device according to some embodiments of the inventive concepts.

FIG. 4 is a cross-sectional view of an integrated circuit semiconductor device according to some embodiments of the inventive concepts.

Specifically, the integrated circuit semiconductor device 20 may be the same as or similar to the integrated circuit semiconductor device 10 of FIG. 2 except that the formation position of a first gate dielectric layer removal region R2a is different. In FIG. 4, the same reference numerals as those in FIG. 2 denote the same elements, and the same content will be simply explained or omitted.

In some embodiments, the integrated circuit semiconductor device 20 may have the first gate dielectric layer removal region R2a formed in the first region NR with respect to the boundary line IF. In some embodiments, a gate dielectric layer removal region may be formed in the second region PR, in contrast to FIG. 4.

The second gate dielectric layer 108b may extend to the first region NR with respect to the boundary line IF. The second gate dielectric layer 108b may extend from the boundary line IF to the first region NR by a distance d5 in the second direction. One end of the first gate dielectric layer 108a may be located at a distance d4 from the boundary line IF to the first region NR in the second direction. Accordingly, the first gate dielectric layer removal region R2a may be a region disposed between the distance d4 from the boundary line IF to the first gate dielectric layer 108a in the direction to the first region NR and the distance d5 from the boundary line IF to the second gate dielectric layer 108b in the direction to the first region NR.

The integrated circuit semiconductor device 20 may include a threshold voltage adjustment layer 114a-1 formed on the second gate dielectric layer 108b in the second region PR. In the second region PR, a distance from the boundary line IF to the threshold voltage adjustment layer 114a-1 may be d6. A second step portion ST2 may be formed between the threshold voltage adjustment layer 114a-1 and the second gate dielectric layer 108b.

FIGS. 5A to 5E are cross-sectional views for explaining a method of manufacturing the integrated circuit semiconductor device of FIG. 2.

Specifically, in FIGS. 5A to 5E, the same reference numerals as in FIGS. 1 and 2 denote the same elements. In FIGS. 5A to 5E, the same content as that of FIGS. 1 and 2 will be briefly described or omitted.

Figure 5A:
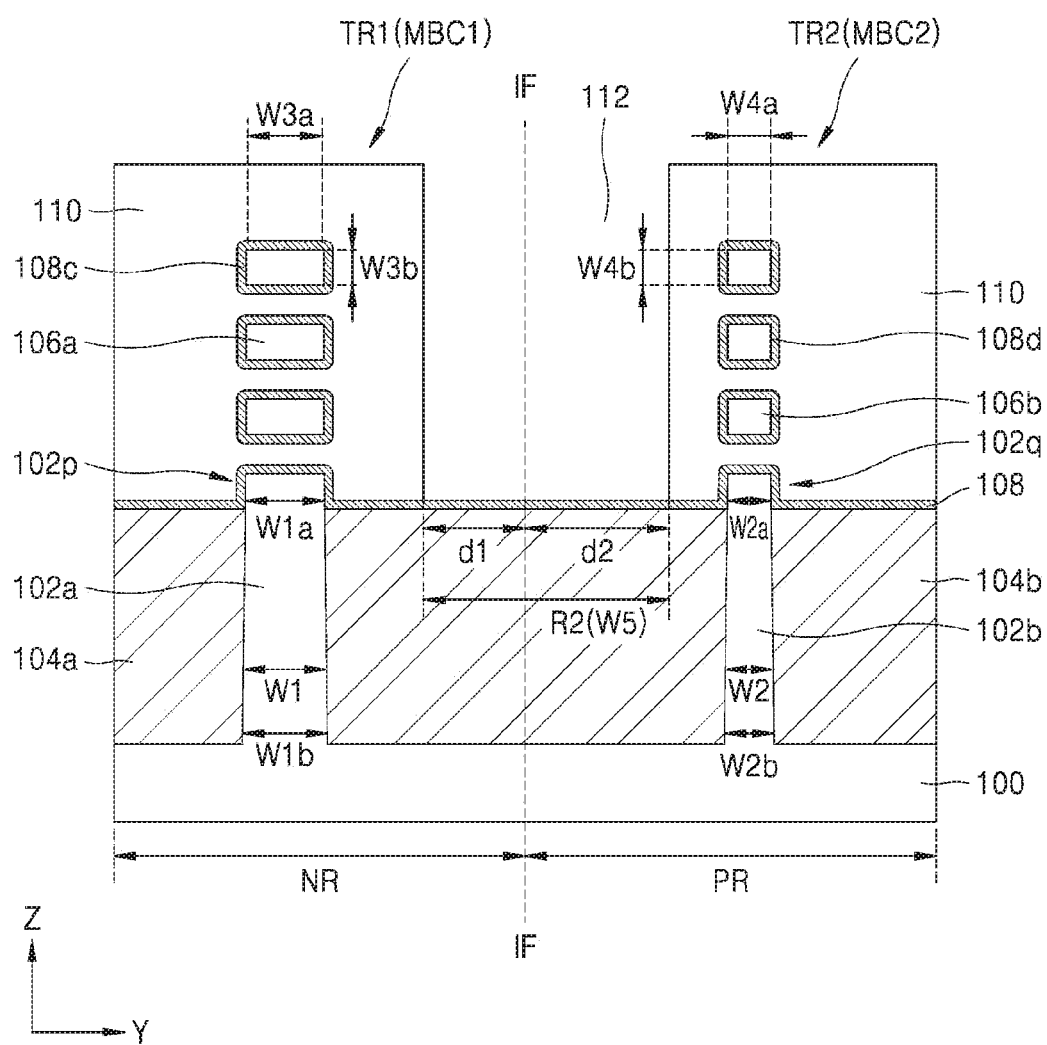
FIGS. 5A to 5E are cross-sectional views for explaining a method of manufacturing the integrated circuit semiconductor device of FIG. 2.

Referring to FIG. 5A, the first active fin 102a including the first fin protrusion portion 102p and the second active fin 102b including the second fin protrusion portion 102q may be formed on the substrate 100 where the first region NR and the second region PR are formed.

The first active fin 102a and the second active fin 102b may be formed to have the first width W1 and the second width W2, respectively. The upper width W1a of the first active fin 102a may be less than the lower width W1b. The upper width W2a of the second active fin 102b may be less than the lower width W2b. The first isolation layer 104a and the second isolation layer 104b may be formed on a portion of the substrate 100, except for the portion of the substrate on which the first active fin 102a and the second active fin 102b are formed.

The plurality of first nanosheets 106a and the plurality of second nanosheets 106b may be formed on or over the first active fin 102a and the second active fin 102b, respectively. The first nanosheets 106a and the second nanosheets 106b may be formed to have the widths W3 and W4, respectively. A gate dielectric material layer 108 may be formed on the first active fin 102a, the second active fin 102b, the first isolation layer 104a, and the second isolation layer 104b. In addition, the third gate dielectric layer 108c and the fourth gate dielectric layer 108d may be formed to surround the first nanosheets 106a and the second nanosheets 106b, respectively.

Subsequently, a first mask pattern 110 having a first opening 112 for exposing a portion of the gate dielectric material layer 108 may be formed in the vicinity of the boundary line IF of the first region NR and the second region PR. The first mask pattern 110 may cover the first active fin 102a, the first nanosheets 106a surrounded by the third gate dielectric layer 108c, the second active fin 102b, the second nanosheets 106b surrounded by the fourth gate dielectric layer 108d, and a portion of the gate dielectric material layer 108. The first opening 112 may correspond to the first gate dielectric layer removal region R2. The first opening 112 may have distances d1 and d2 from the boundary line IF toward the first region NR and the second region PR in the second direction, respectively.

Figure 5B:
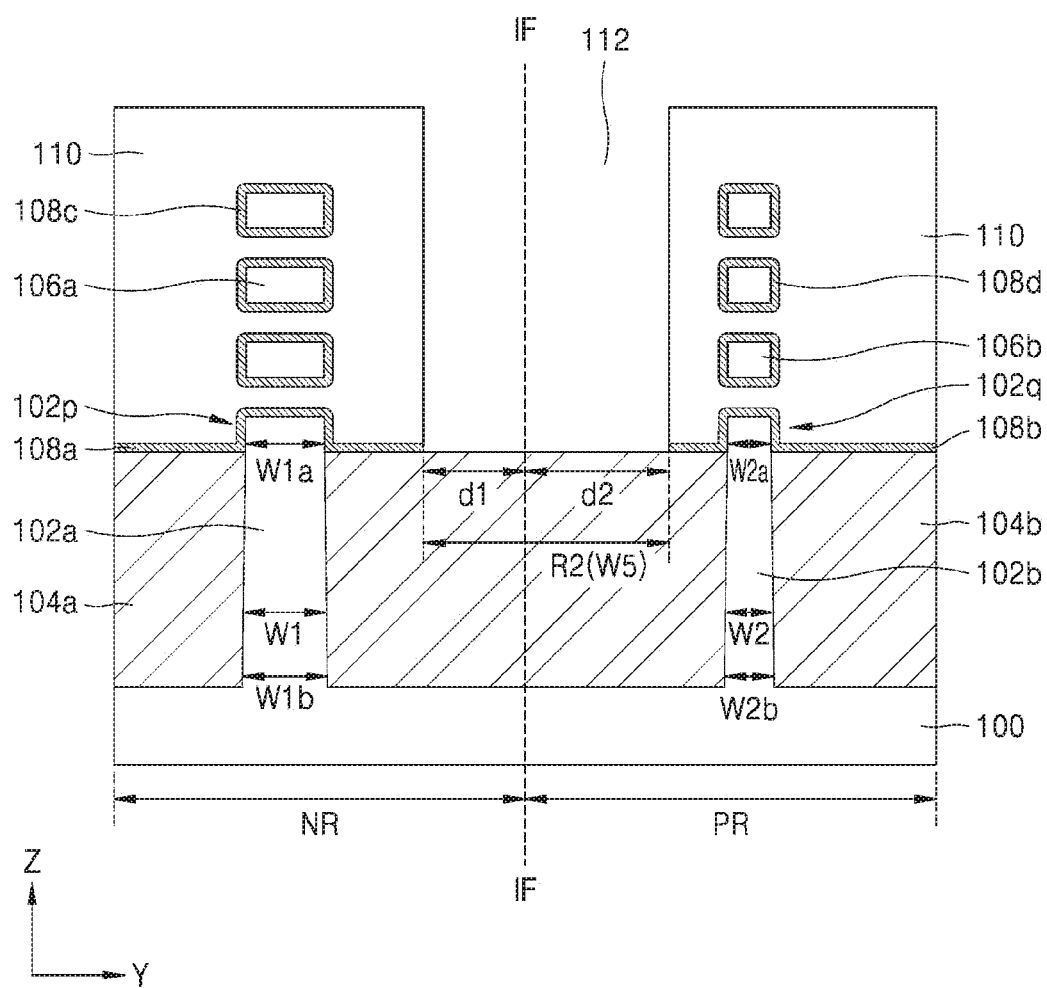
Figure 5C:
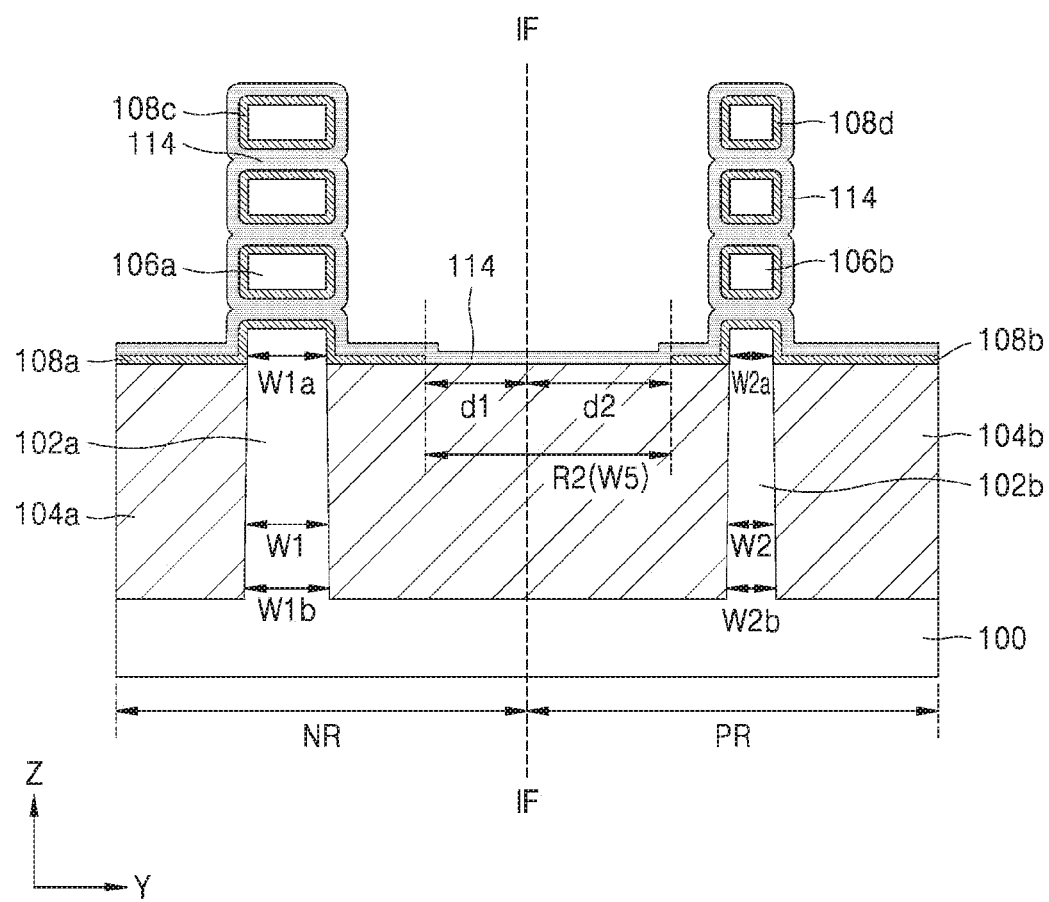

Referring to FIGS. 5B and 5C, a portion of the gate dielectric material layer 108 may be etched by using the first mask pattern 110 as an etch mask to form the first gate dielectric layer 108a and the second gate dielectric layer 108b as shown in FIG. 5B. Accordingly, the first gate dielectric layer removal region R2 at which the portion of the gate dielectric material layer 108 in FIG. 5A is removed may be formed in the vicinity of the boundary line IF of the first region NR and the second region PR. The width of the first gate dielectric layer removal region R2 may be W5. The first gate dielectric layer removal region R2 may have distances d1 and d2 from the boundary line IF toward the first region NR and the second region PR in the second direction, respectively.

The first mask pattern 110 in FIG. 5B may be removed as shown in FIG. 5C. A threshold voltage adjustment material layer 114 may be formed on the first gate dielectric layer 108a, the third gate dielectric layer 108c surrounding the first nanosheets 106a, the second gate dielectric layer 108b, the fourth gate dielectric layer 108d surrounding the second nanosheets 106b, the first isolation layer 104a, and the second isolation layer 104b. The threshold voltage adjustment material layer 114 may be formed on the entire surface of the substrate 100.

Figure 5D:
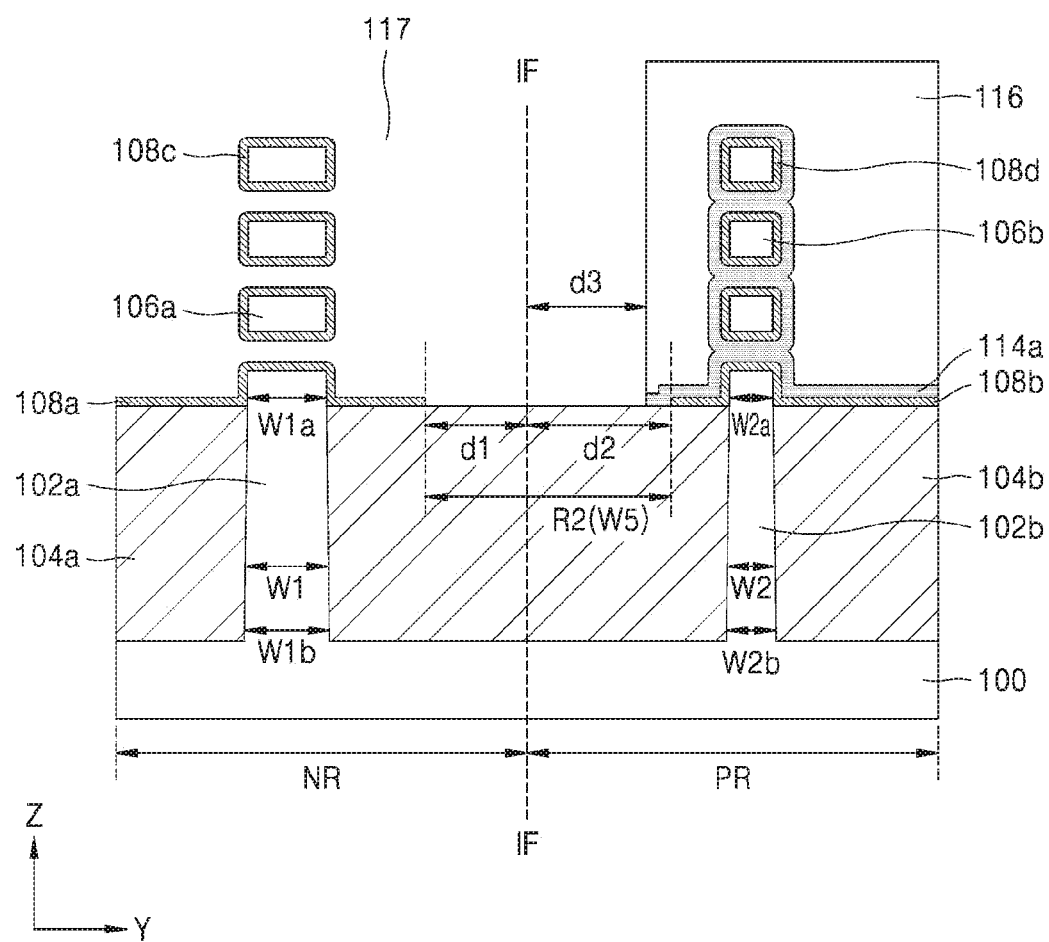
Figure 5E:
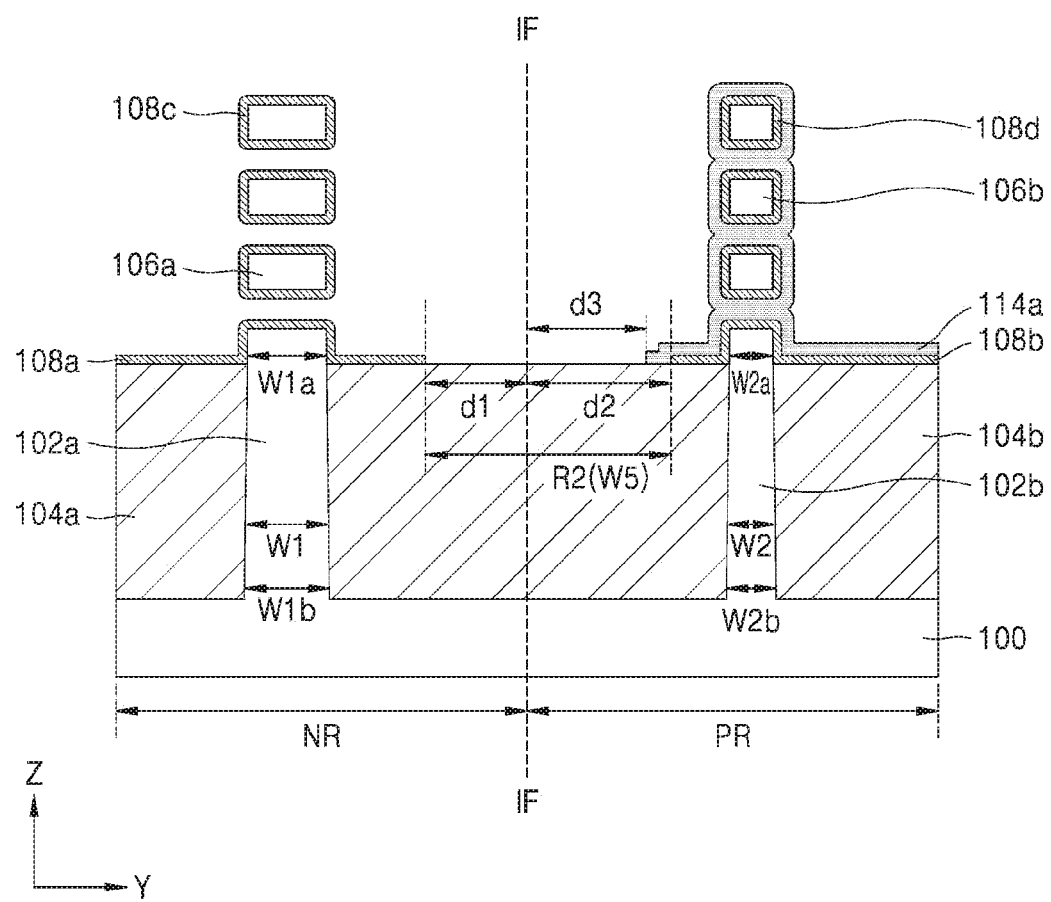

Referring to FIGS. 5D and 5E, a second mask pattern 116 may be formed to have a second opening 117 exposing all of the first region NR and a portion of the threshold voltage adjustment material layer 114 of the second region PR, as shown in FIG. 5D. A distance of the second opening 117 from the boundary IF to the second mask pattern 116 may be d3. Then, the threshold voltage adjustment layer 114a may be formed in the second region PR by etching a portion of the threshold voltage adjustment material layer 114 in the first region NR in FIG. 5C by using the second mask pattern 116 as an etch mask.

As shown in FIG. 5E, the second mask pattern 116 may be removed. In this case, the distance from the boundary line IF to one end of the threshold voltage adjustment layer 114a in the second region PR may be d3. Further, as shown in FIG. 2, the first gate electrode 118a and the second gate electrode 118b may be formed on the first region NR and the second region PR, respectively.

Figure 6A:
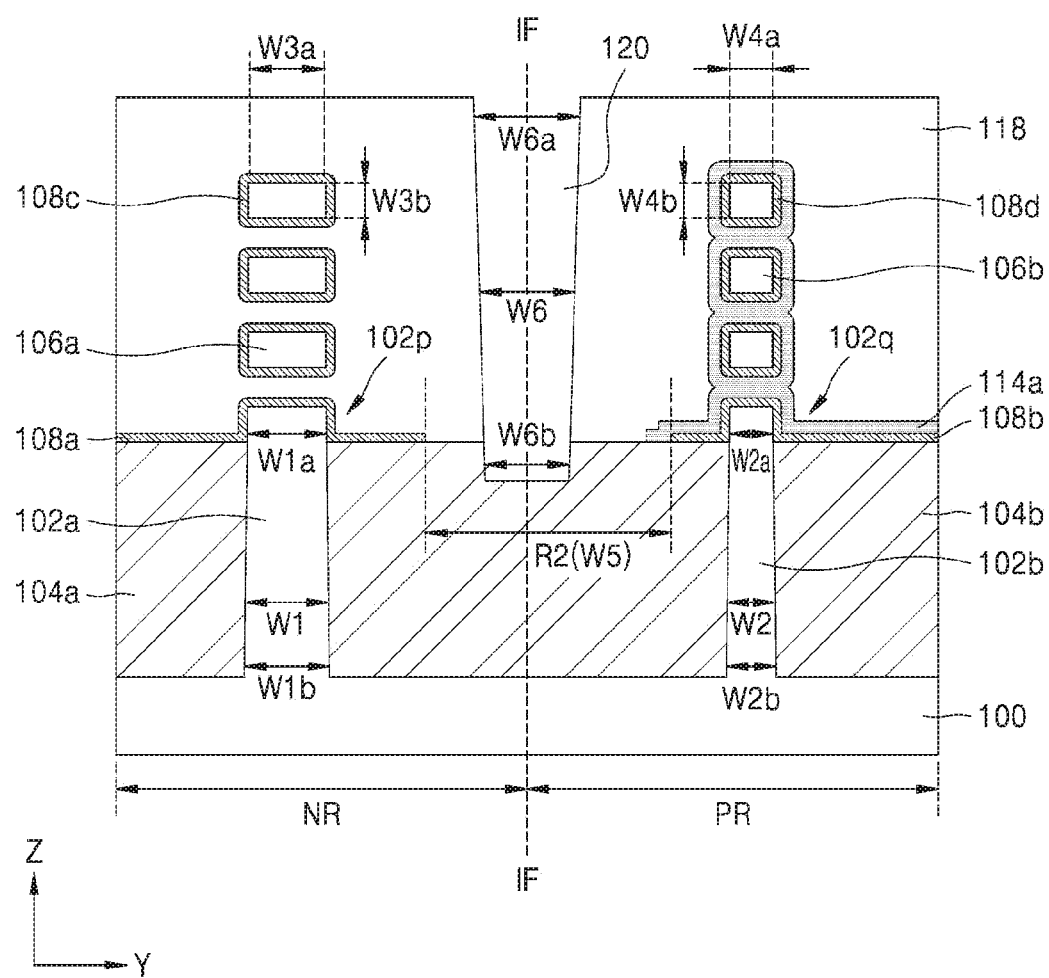
FIGS. 6A and 6B are cross-sectional views for explaining a method of manufacturing the integrated circuit semiconductor device of FIG. 3.
Figure 6B:
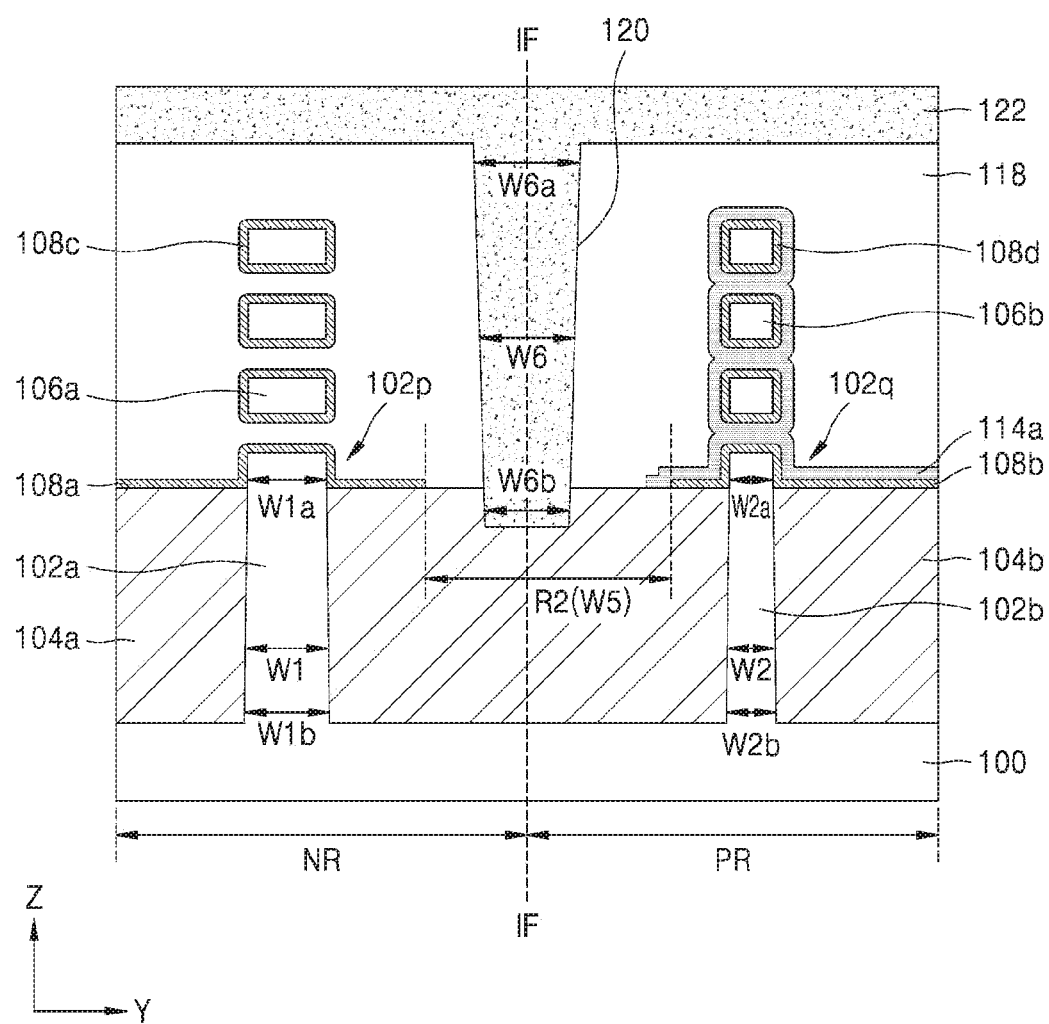

FIGS. 6A and 6B are cross-sectional views for explaining a method of manufacturing the integrated circuit semiconductor device of FIG. 3.

Specifically, in FIGS. 6A and 6B, the same reference numerals as in FIGS. 1 to 3 and FIGS. 5A to 5E denote the same elements. In FIGS. 6A and 6B, the same contents as those in FIGS. 1 to 3 and FIGS. 5A to 5E may be briefly described or omitted.

As described above with reference to FIGS. 2 and 5A to 5E, the first gate electrode 118a and the second gate electrode 118b may be formed on the first region NR and the second region PR, respectively. As shown in FIG. 2, the first gate electrode 118a and the second gate electrode 118b may be connected to each other.

Next, as shown in FIG. 6A, a third opening 120 may be formed through the first gate electrode 118a and the second gate electrode 118b in the vicinity of the boundary line IF of the first region NR and the second region PR. A bottom of the third opening 120 may be below upper surfaces of the isolation layers 104a and 104b.

Since the third opening 120 may be formed in the first gate dielectric layer removal region R2, the third opening 120 may be more easily formed. In addition, since the third opening 120 may be formed in a region where a gate dielectric layer is removed, the third opening 120 may be more easily formed without excessively damaging an interlayer insulating layer (not shown) formed around the first gate electrode 118a and the second gate electrode 118b.

The width of the third opening 120 in the second direction may be W6. One side wall of the third opening 120 may be inclined from the upper surfaces of the first gate electrode 118a and the second gate electrode 118b toward the bottom surfaces thereof. In some embodiments, a bottom width W6b of the third opening 120 may be less than a top or upper width W6a. The first gate electrode 118a and the second gate electrode 118b may be separated from each other due to the third opening 120.

As shown in FIG. 6B, a gate cut material layer 122 may be formed on the first gate electrode 118a and the second gate electrode 118b while filling the third opening 120. The gate cut material layer 122 may be planarized to form the gate cut pattern 124 as shown in FIG. 3.

The gate cut pattern 124 may define the first gate cut region CT1 as shown in FIG. 3. The first gate electrode 118a and the second gate electrode 118b may be electrically separated from each other due to the gate cut pattern 124 constituting the first gate cut region CT1.

Figure 7:
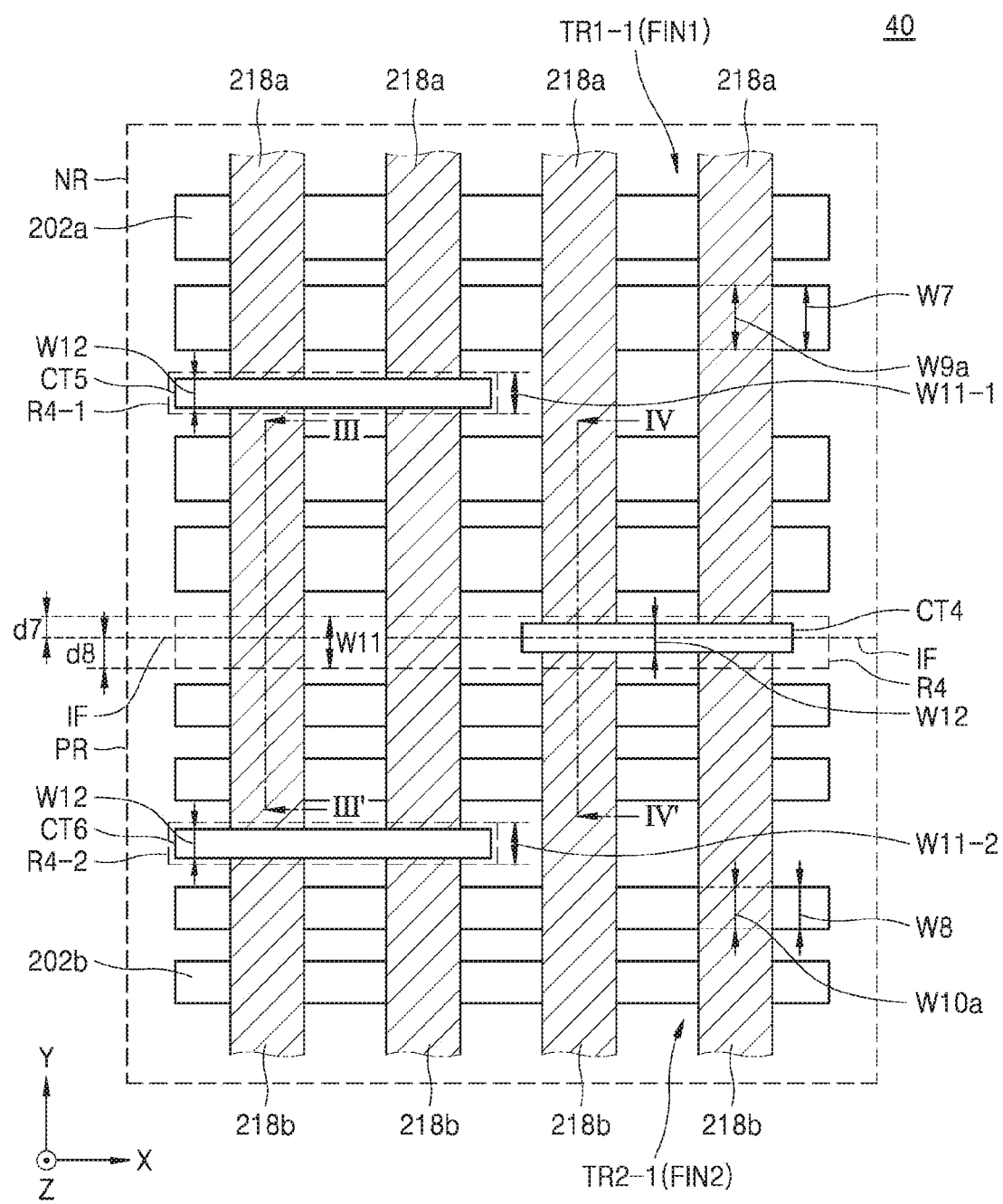
FIG. 7 is a layout diagram of an integrated circuit semiconductor device according to some embodiments of the inventive concepts.

FIG. 7 is a layout diagram of an integrated circuit semiconductor device according to some embodiments of the inventive concepts.

Specifically, an integrated circuit semiconductor device 40 may be the same as or similar to the integrated circuit semiconductor device 10 of FIG. 1, except that first transistors TR1-1 and second transistors TR2-1 include fin type transistors. Regarding FIG. 7, the description corresponding to FIG. 1 may be briefly described or omitted. The integrated circuit semiconductor device 40 may include a plurality of cell transistors, for example, MOS transistors. The cell transistors may be fin type transistors.

The integrated circuit semiconductor device 40 may include a first region NR and a second region PR. In some embodiments, the first region NR may be a region where a plurality of first transistors TR1-1, for example, first fin type transistors FIN1, are formed. The first fin type transistor FIN1 may be N-type transistor, for example, N-type MOS transistor.

In some embodiments, the second region PR may be a region where a plurality of second transistors TR2-1, for example, second fin type transistors FIN2, are formed. The second fin type transistor FIN2 may be P-type transistor, for example, P-type MOS transistor.

In FIG. 7, a first direction (an X direction) may be a direction of a channel length, and a second direction (a Y direction) may be a direction of a channel width. The first transistors TR1-1 and the second transistors TR2-1 of the first region NR and the second region PR may include at least one active fin 202a and 202b, respectively. For example, in some embodiments, the first transistors TR1-1 and the second transistors TR2-1 of the first region NR and the second region PR may include at least two active fins 202a and 202b, respectively.

Hereinafter, the channel width will be described based on an example in which the first transistors TR1-1 and the second transistors TR2-1 include one active fin 202a and 202b, respectively. Hereinafter, a layout of the integrated circuit semiconductor device 40 will be described in more detail, but the inventive concepts are not limited to the layout shown in FIG. 7.

The integrated circuit semiconductor device 40 may include a plurality of first active fins 202a and a plurality of second active fins 202b, the first active fins 202a and the second active fins 202b extending in the first direction. A first width of the first active fins 202a, i.e., the first width in the second direction, may be W7. A second width of the second active fins 202b, i.e., the second width in the second direction, may be W8 which is different from the first width W7. In some embodiments, the first width W7 may be greater than the second width W8.

The first active fins 202a located in the first region NR may be provided as an active region of the first transistor TR1-1. The second active fins 202b located in the second region PR may be provided as an active region of the second transistor TR2-1. An isolation layer may be provided between the first active fins 202a.

The integrated circuit semiconductor device 40 may include a plurality of first gate electrodes 218a and a plurality of second gate electrodes 218b, extending in the second direction perpendicular to the first direction in which the first active fins 202a and the second active fins 202b extend. A first channel width in the second direction of the first transistors TR1-1 in the first region NR may be determined by a width W9a of the first active fin 202a located under the first gate electrode 218a.

A second channel width in the second direction of the second transistors TR2-1 in the second region PR may be different from the first channel width, and may be determined by a width W10a of the second active fin 202b located under the second gate electrode 218b. Since the width W9a of the first active fin 202a located under the first gate electrode 218a and the width W10a of the second active fin 202b located under the second gate electrode 218b may be different from each other, the first channel width of the first transistor TR1-1 may be different from the second channel width of the second transistor TR2-1. In some embodiments, the first channel width of the first transistor TR1-1 may be greater than the second channel width of the second transistor TR2-1.

The first region NR and the second region PR may be disposed in contact with or immediately adjacent each other in the second direction (the Y direction) in the layout diagram. The plurality of first transistors TR1-1 may be formed in the second direction in the first region NR. The plurality of second transistors TR2-1 may be formed in the second direction in the second region PR. Source/drain regions (not shown) may be formed in the first active fins 202a and 202b on both sides of the gate electrodes 218a and 218b in the first direction.

A boundary, for example a boundary line IF, extending in the first direction (the X direction) may be defined at an interface between the first region NR and the second region PR. The boundary line IF may be a metal gate boundary line. As described above, threshold voltages of the first transistors TR1-1 of the first region NR and threshold voltages of the second transistors TR2-1 of the second region PR may deviate from designed values by the metal gate boundary effect depending on distances by which the transistors TR1-1 and TR2-1 are spaced apart from the boundary line IF.

In order to reduce or prevent the metal gate boundary effect, according to the inventive concepts, a first gate dielectric layer removal region R4 may be disposed in the vicinity of the boundary line IF of the first region NR and the second region PR. The first gate dielectric layer removal region R4 may be disposed to be shifted to or offset toward either the first region NR or the second region PR in the second direction with respect to the boundary line IF.

The first gate dielectric layer removal region R4 may have different distances from the boundary line IF toward the first region NR and the second region PR in the second direction, respectively. Accordingly, the threshold voltages of the first transistors TR1-1 and the second transistors TR2-1 respectively located in the first region NR and the second region PR may be reduced or prevented from deviating from the designed values.

In some embodiments, a width of the first gate dielectric layer removal region R4 in the second direction may be W11. The first gate dielectric layer removal region R4 may respectively have a distance d7 and d8 from the boundary line IF toward the first region NR and the second region PR in the second direction.

In the first gate dielectric layer removal region R4, a first gate cut region CT4 where the first and second gate electrodes 218a and 218b are separated or broken in the second direction may be located. The first gate cut region CT4 may be more easily formed in the first gate dielectric layer removal region R4. In some embodiments, a width (in the second direction) of the first gate cut region CT4 may be W12. A second gate cut pattern defining the first gate cut region CT4 may include an insulating layer, for example, a silicon nitride layer.

In some embodiments, a second gate dielectric layer removal region R4-1 may be located in the first region NR. In some embodiments, a width W11-1 of the second gate dielectric layer removal region R4-1 in the second direction may be equal to or less than the width W11 of the first gate dielectric layer removal region R4. A second gate cut region CT5 where the first gate electrode 218a is separated or broken may be disposed in the second gate dielectric layer removal region R4-1 of the first region NR.

In some embodiments, a width (in the second direction) of the second gate cut region CT5 may be W12, equal to the width of the first gate cut region CT4. A second gate cut pattern defining the second gate cut region CT5 may include an insulating layer, for example, a silicon nitride layer.

In some embodiments, a third gate dielectric layer removal region R4-2 may be located in the second region PR. A width of the third gate dielectric layer removal region R4-2 in the second direction may be W11-2, which is equal to or less than W11.

A third gate cut region CT6 in which the second gate electrode 218b is separated or broken may be disposed in the second region PR. In some embodiments, a width (in the second direction) of the third gate cut region CT6 may be W12, equal to the widths of the first gate cut region CT4 and the second gate cut region CT5. A gate cut pattern defining the third gate cut region CT6 may include an insulating layer, for example, a silicon nitride layer.

Figure 8:
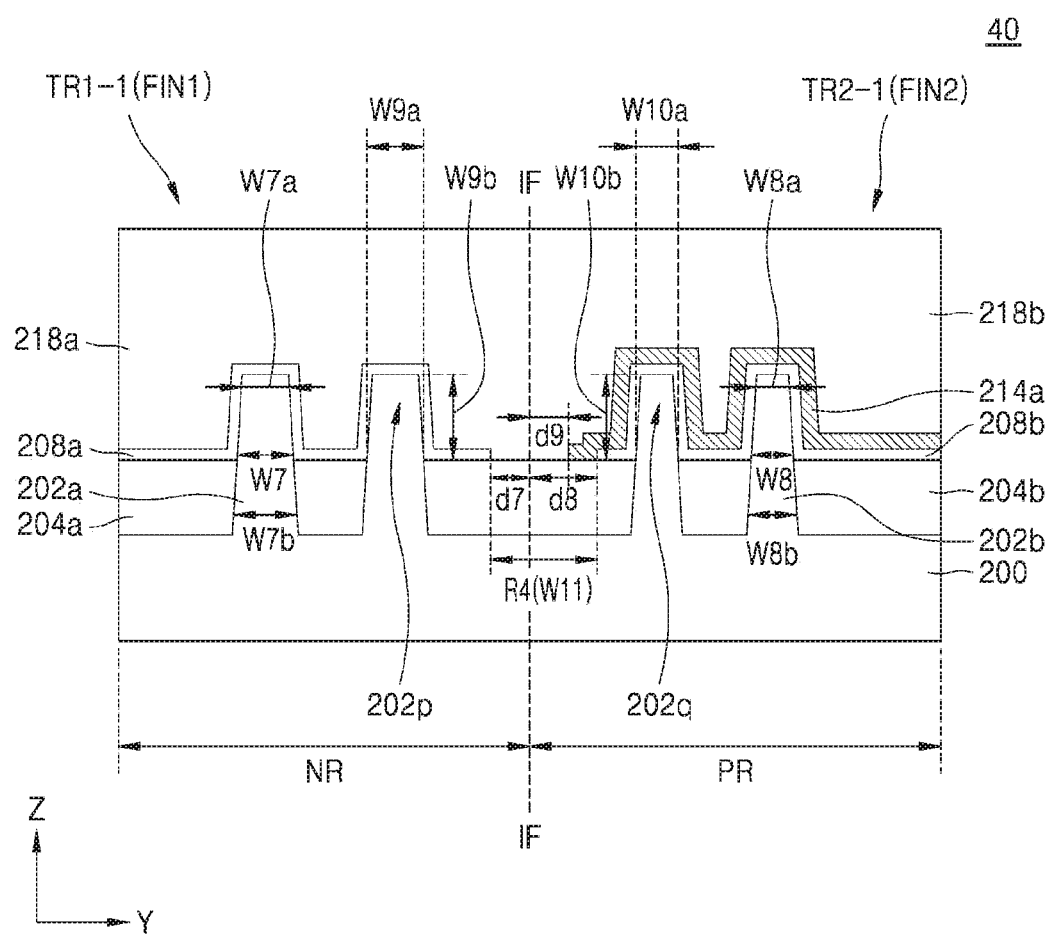
FIG. 8 is a cross-sectional view taken along line of the integrated circuit semiconductor device of FIG. 7.

FIG. 8 is a cross-sectional view taken along line of the integrated circuit semiconductor device of FIG. 7.

Specifically, the integrated circuit semiconductor device 40 may include the first transistor TR1-1 and the second transistor TR2-1 in the first region NR and the second region PR, respectively. The first transistor TR1-1 and the second transistor TR2-1 may be a first fin type transistor FIN1 and a second fin type transistor FIN2, respectively. The integrated circuit semiconductor device 40 may include the first active fin 202a and the second active fin 202b protruding from a substrate 200 in a third direction (a Z direction). The substrate 200 may include the same material as the substrate 100 of FIG. 2 described above.

The first active fin 202a and the second active fin 202b may extend in the first direction (the X direction) as described above. The first active fin 202a and the second active fin 202b may have different widths in the Y direction, i.e., the widths of W7 and W8.

In some embodiments, a first width W7 of the first active fin 202a may be greater than a second width W8 of the second active fin 202b in the second direction. In some embodiments, an upper width W7a of the first active fin 202a may be less than a lower width W7b thereof. An upper width W8a of the second active fin 202b may be less than a lower width W8b thereof.

A first isolation layer 204a and a second isolation layer 204b may be formed on the substrate 200 except for the first active fin 202a and the second active fin 202b. The first isolation layer 204a and the second isolation layer 204b may include a silicon oxide film, a silicon nitride film, or a combination thereof. The first isolation layer 204a and the second isolation layer 204b may be formed around the first active fin 202a and the second active fin 202b.

In some embodiments, the first active fin 202a and the second active fin 202b may include a first fin protrusion portion 202p and a second fin protrusion portion 202q which protrude from surfaces of the first isolation layer 204a and the second isolation layer 204b, respectively. The width and height of the first fin protrusion portion 202p defining the first active fin 202a in the first region NR may be W9a and W9b, respectively.

In the first region NR, a first gate dielectric layer 208a may extend from the first active fin 202a and the first fin protrusion portion 202p onto the first isolation layer 204a in the second direction (the Y direction). The first gate dielectric layer 208a may be formed on an upper surface and a side surface of the first fin protrusion portion 202p and on a portion of an upper surface of the first isolation layer 204a. The first gate electrode 218a may be formed on the first gate dielectric layer 208a.

In the second region PR, a second gate dielectric layer 208b may extend from the second active fin 202b and the second fin protrusion portion 202q onto the second isolation layer 204b in the second direction (the Y direction). The second gate dielectric layer 208b may be formed on an upper surface and a side surface of the second fin protrusion portion 202q and on a portion of an upper surface of the second isolation layer 204b.

The first gate dielectric layer 208a and the second gate dielectric layer 208b may include the same material as the first to fourth gate dielectric layers 108a to 108d described above with reference to FIG. 2. The first gate electrode 218a and a second gate electrode 218b (discussed below) may include the same material as the first gate electrode 118a and the second gate electrode 118b described above with reference to FIG. 2.

The width and height of the second fin protrusion portion 202q defining the second active fin 202b in the second region PR may be W10a and W10b, respectively. In some embodiments, a threshold voltage adjustment layer 214a may be formed on the second gate dielectric layer 208b of the second region PR. The threshold voltage adjustment layer 214a may include a metal material having a work function that matches the threshold voltage characteristics of the second transistor TR2-1, for example, a P-type transistor. In some embodiments, the threshold voltage adjustment layer 214a may include Ti, TiN, Ta, TaN, and the like.

A second gate electrode 218b may be formed on the threshold voltage adjustment layer 214a. In embodiments where the threshold voltage adjustment layer 214a is not formed, the second gate electrode 218b may be formed on the second gate dielectric layer 208b. The first gate electrode 218a and the second gate electrode 218b may be connected to each other.

A first channel width of the first transistors TR1-1 in the second direction in the first region NR may be determined by the width W9a and the height W9b of the first fin protrusion portion 202p. That is, the first channel width may be (W9a+2×W9b). A second channel width of the second transistors TR2-1 in the second direction in the second region PR may be determined by the width W10a and height W10b of the second fin protrusion portion 202q. That is, the second channel width may be (W10a+2×W10b).

In some embodiments, since the width W9a of the first fin protrusion portion 202p may be different from the width W10a of the second fin protrusion portion 202q, the first channel width and the second channel width may be different. In some embodiments, when the width W9a of the first fin protrusion portion 202p is greater than the width W10a of the second fin protrusion portion 202q, the first channel width may be greater than the second channel width.

In order to reduce or prevent the metal gate boundary effect, the first gate dielectric layer removal region R4 where the gate dielectric layer is not formed may be located in the vicinity of the boundary line IF between the first region NR and the second region PR. The width (in the second direction) of the first gate dielectric layer removal region R4 may be W11.

The first gate dielectric layer removal region R4 may be disposed to be shifted to or offset toward either the first region NR or the second region PR in the second direction (the Y direction) with respect to the boundary line IF. In some embodiments, opposing edges of the first gate dielectric layer removal region R4 may have different distances d7 and d8 from the boundary line IF to the first gate dielectric layer 208a and the second gate dielectric layer 208b, respectively. In some embodiments, the first gate dielectric layer removal region R4 may have the distance d7 from the boundary line IF to the first gate dielectric layer 208a, in which the distance d7 may be less than the distance d8 from the boundary line IF to the second gate dielectric layer 208b.

The threshold voltage adjustment layer 214a may be formed on one side of the first gate dielectric layer removal region R4 to cover the second gate dielectric layer 208b. The threshold voltage adjustment layer 214a may not be connected to the first gate dielectric layer 208a. A step portion may be formed on one side of the first gate dielectric layer removal region R4 of the second region PR due to the threshold voltage adjustment layer 214a.

Figure 9:
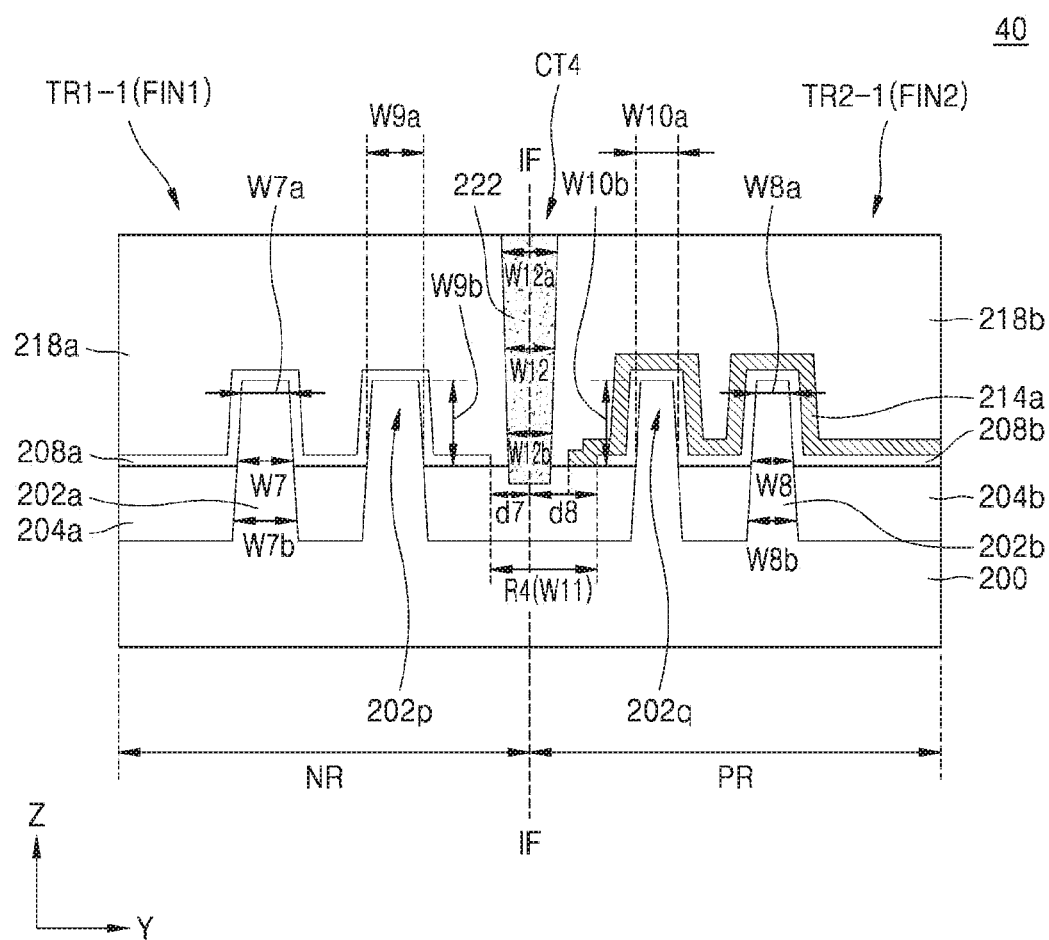
FIG. 9 is a cross-sectional view taken along line IV-IV' of the integrated circuit semiconductor device of FIG. 7.

FIG. 9 is a cross-sectional view taken along line IV-IV' of the integrated circuit semiconductor device of FIG. 7.

Specifically, the same reference numerals in FIGS. 7 and 9 denote the same elements. The integrated circuit semiconductor device 40 of FIG. 9 may further include the first gate cut region CT4. The first gate cut region CT4 may be a region that cuts or separates the first and second gate electrodes 218a and 218b in the first gate dielectric layer removal region R4. Since the first gate cut region CT4 may be formed in the first gate dielectric layer removal region R4, the first gate cut region CT4 may be more easily formed. In some embodiments, the width (in the second direction) of the first gate cut region CT4 may be W12. The first gate electrode 218a and the second gate electrode 218b may be separated by the first gate cut region CT4.

In some embodiments, one side wall of a gate cut pattern 222 defining the first gate cut region CT4 may be inclined in the third direction (the Z direction) perpendicular to a plane defined by the first direction and the second direction. In other words, the side wall of the gate cut pattern 222 may be inclined from the upper surfaces of the first gate electrode 218a and the second gate electrode 218b toward the bottom surfaces thereof. In some embodiments, a bottom width W12b of the gate cut pattern 222 may be less than a top or upper width W12a.

Figure 10:
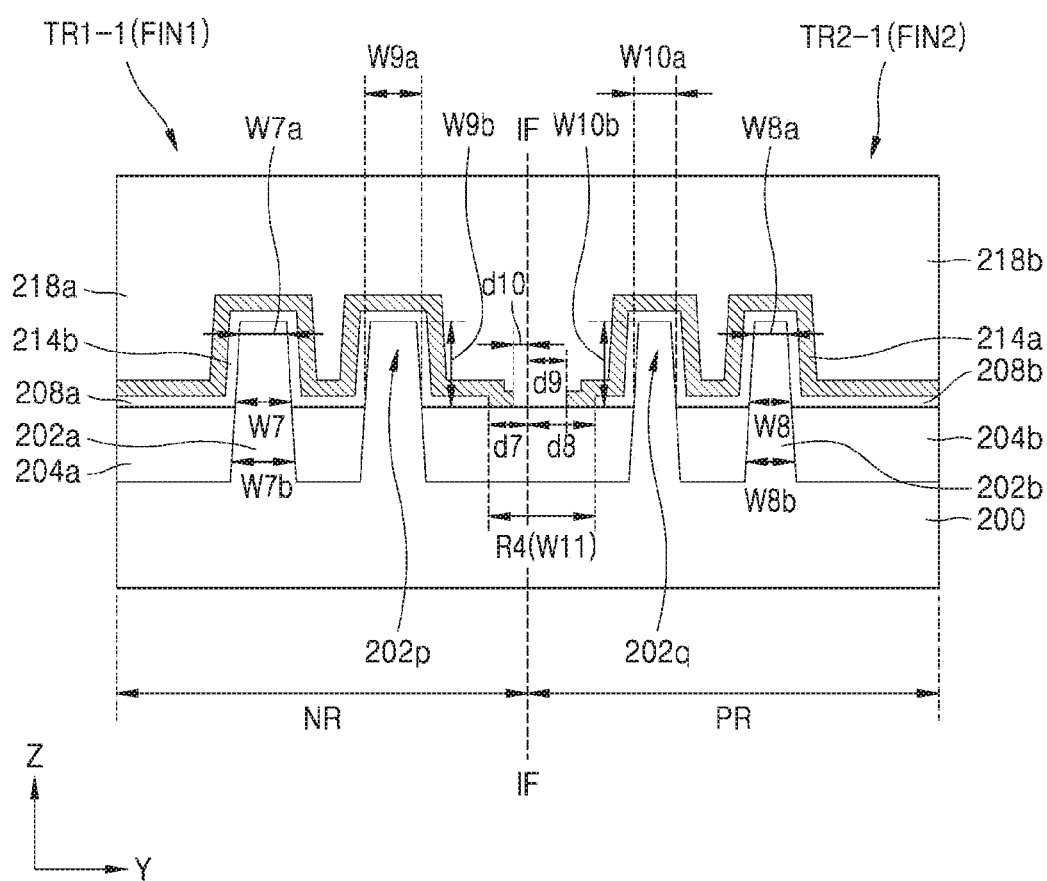
FIGS. 10 and 11 are cross-sectional views of an integrated circuit semiconductor device according to some embodiments of the inventive concepts.
Figure 11:
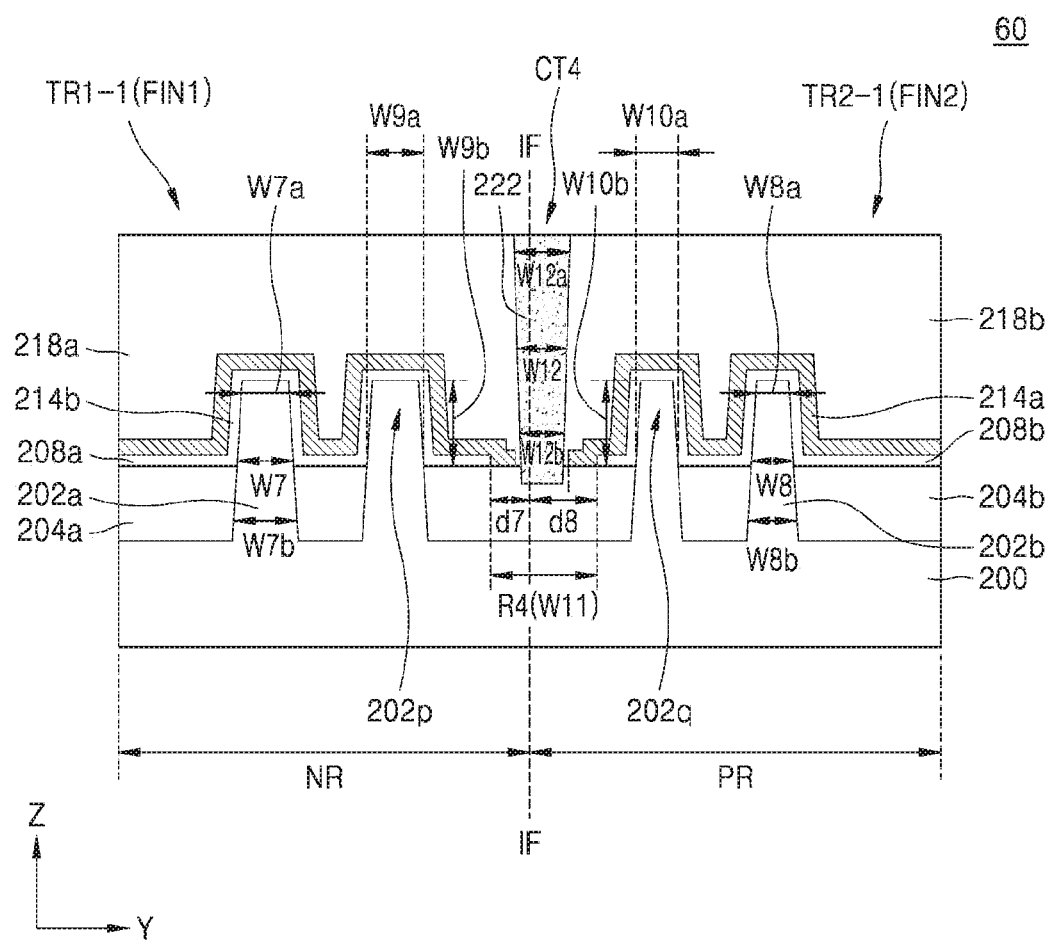

FIGS. 10 and 11 are cross-sectional views of an integrated circuit semiconductor device according to some embodiments of the inventive concepts.

Specifically, in FIGS. 10 and 11, the same reference numerals as those in FIGS. 7 and 8 denote the same elements. The integrated circuit semiconductor device 60 of FIG. 10 may be the same as or similar to the integrated circuit semiconductor device 40 of FIG. 8, except that the integrated circuit semiconductor device 60 includes a second threshold voltage adjustment layer 214b as compared to FIG. 8. The integrated circuit semiconductor device 60 of FIG. 11 may be the same as or similar to the integrated circuit semiconductor device 40 of FIG. 9, except that the integrated circuit semiconductor device 60 includes the second threshold voltage adjustment layer 214b as compared to FIG. 9.

As shown in FIGS. 10 and 11, the second threshold voltage adjustment layer 214b may be formed on the first gate dielectric layer 208a of the first region NR. The second threshold voltage adjustment layer 214b may include a metal material having a work function that matches a threshold voltage characteristic of the first transistor TR1-1, for example, an N-type transistor. In some embodiments, the second threshold voltage adjustment layer 214b may include TiAlC, TiAlCN, TiAlSiCN, and the like The second threshold voltage adjustment layer 214b may not be connected to the second gate dielectric layer 208b of the second region PR. The threshold voltage of the first transistor TR1-1 may be more easily adjusted by forming the second threshold voltage adjustment layer 214b in the first region NR.

In addition, as shown in FIG. 11, the integrated circuit semiconductor device 60 may further include the first gate cut region CT4. The first gate cut region CT4 may be a region for cutting the first and second gate electrodes 218a and 218b in the first gate dielectric layer removal region R4. Since the first gate cut region CT4 is formed in the first gate dielectric layer removal region R4, the first gate cut region CT4 may be more easily formed. The first gate electrode 218a and the second gate electrode 218b may be separated by the first gate cut region CT4.

FIGS. 12A to 12E are cross-sectional views for explaining a method of manufacturing the integrated circuit semiconductor device of FIG. 8.

Specifically, in FIGS. 12A to 12E, the same reference numerals as in FIGS. 7 and 8 denote the same elements. In FIGS. 12A to 12E, the same content as that of FIGS. 7 and 8 will be briefly described or omitted.

Figure 12A:
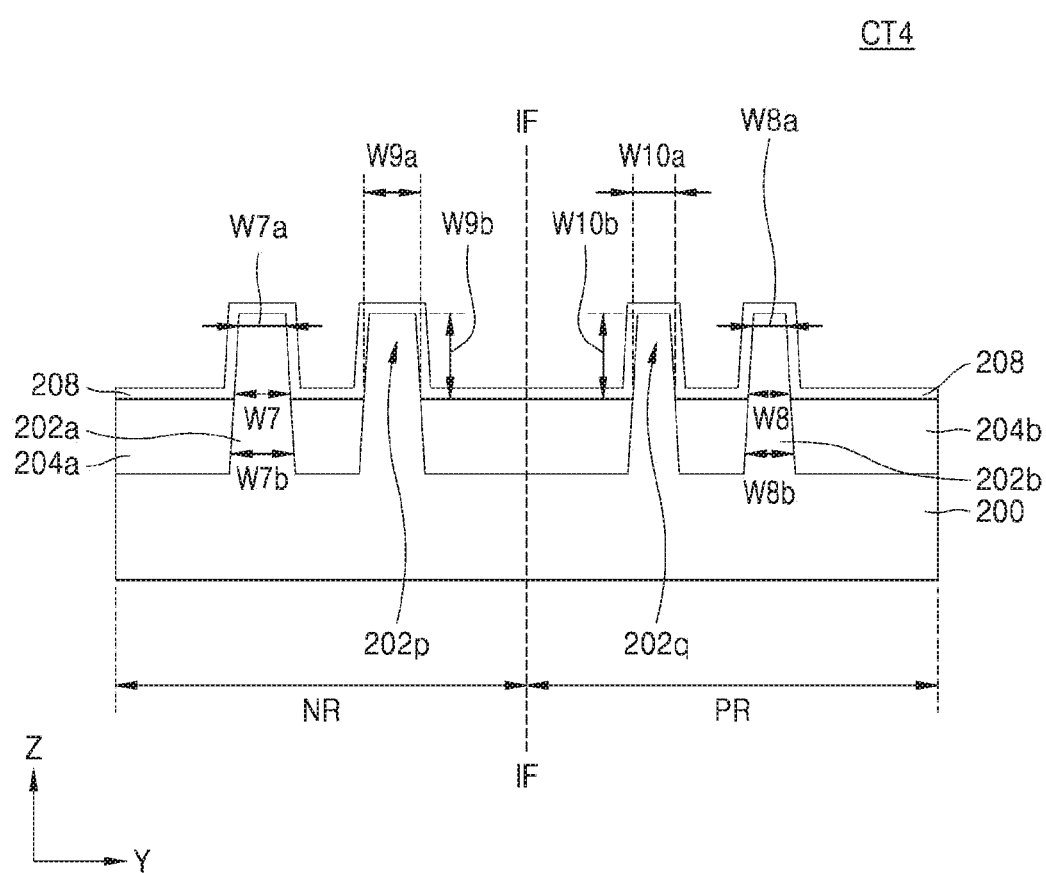
FIGS. 12A to 12E are cross-sectional views for explaining a method of manufacturing the integrated circuit semiconductor device of FIG. 8.

Referring to FIG. 12A, the first active fin 202a including the first fin protrusion portion 202p and the second active fin 202b including the second fin protrusion portion 202q may be formed on the substrate 200 on which the first region NR and the second region PR are formed.

The first active fin 202a and the second active fin 202b may be formed to have the first width W7 and the second width W8, respectively. The upper width W7a of the first active fin 202a may be less than the lower width W7b. The upper width W8a of the second active fin 202b may be less than the lower width W8b. Then, the first isolation layer 204a and the second isolation layer 204b may be formed on the substrate 200, except for a region that the first active fin 202a and the second active fin 202b are formed.

The gate dielectric material layer 208 may be formed on the first active fin 202a, the second active fin 202b, the first isolation layer 204a, and the second isolation layer 204b. A first mask pattern 210 having a first opening 212 for exposing a portion of the gate dielectric material layer 208 in the vicinity of the boundary line IF of the first region NR and the second region PR.

The first mask pattern 210 may cover the first active fin 202a, the second active fin 102b, and a portion of the gate dielectric material layer 208. The first opening 212 may correspond to the first gate dielectric layer removal region R4. Edges of the first opening 212 may have the distances d7 and d8 from the boundary IF toward the first region NR and the second region PR in the second direction, respectively.

Figure 12B:
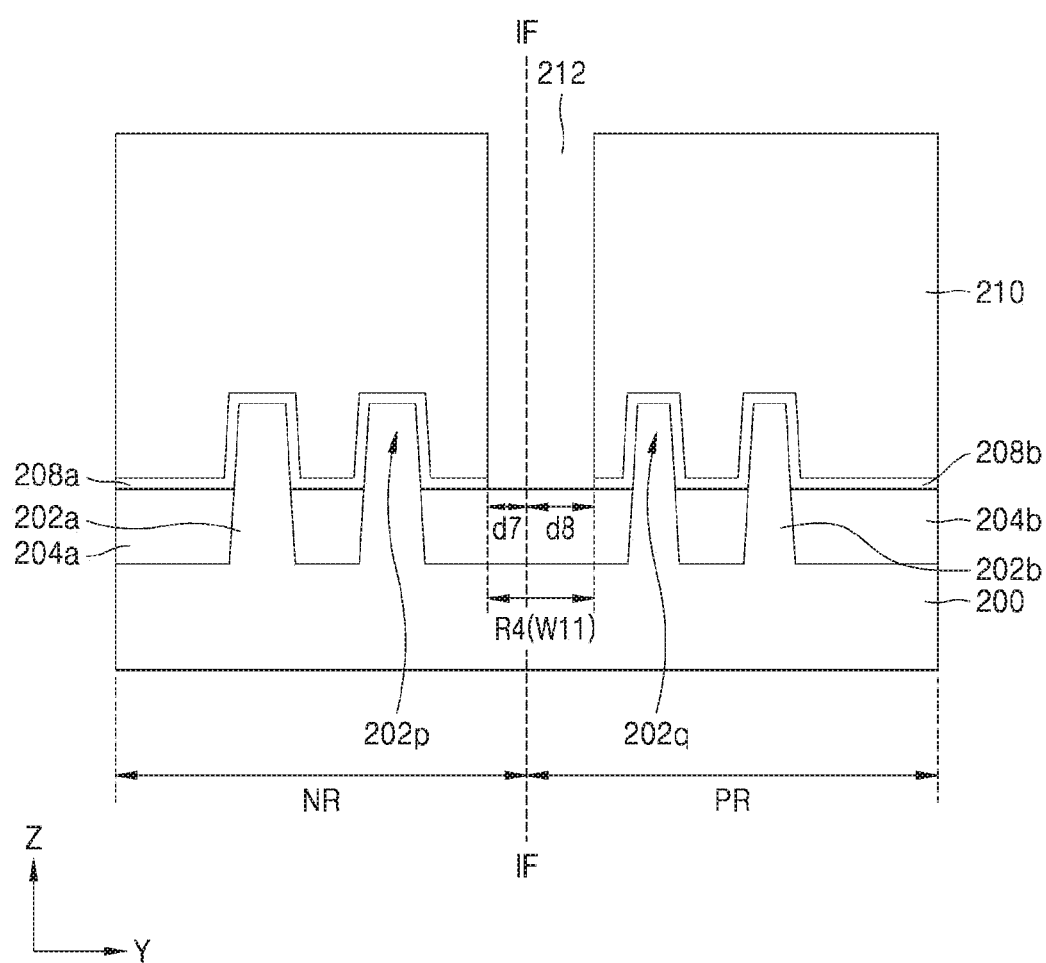
Figure 12C:
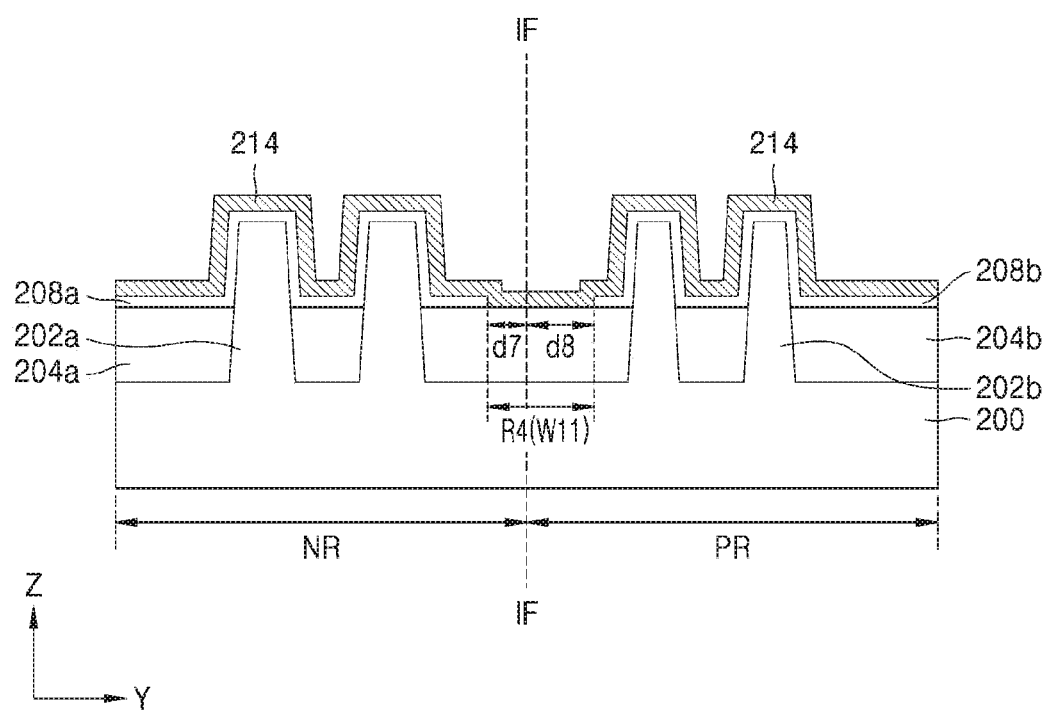

Referring to FIGS. 12B and 12C, the gate dielectric material layer 208 may be etched by using the first mask pattern 210 as an etch mask to form the first gate dielectric layer 208a and the second gate dielectric layer 208b as shown in FIG. 12B.

Accordingly, the first gate dielectric layer removal region R4 may be formed, in which the gate dielectric material layer 208 in FIG. 12A is removed in the vicinity of the boundary line IF of the first region NR and the second region PR. The width of the first gate dielectric layer removal region R4 may be W11. Edges of the first gate dielectric layer removal region R4 may have distances d7 and d8 from the boundary line IF toward the first region NR and the second region PR in the second direction, respectively.

The first mask pattern 210 in FIG. 12B may be removed as shown in FIG. 12C. A threshold voltage adjustment material layer 214 may be formed on the first gate dielectric layer 208a, the second gate dielectric layer 208b, the first isolation layer 204a, and the second isolation layer 204b. The threshold voltage adjustment material layer 214 may be formed on the entire surface of the substrate 200.

Figure 12D:
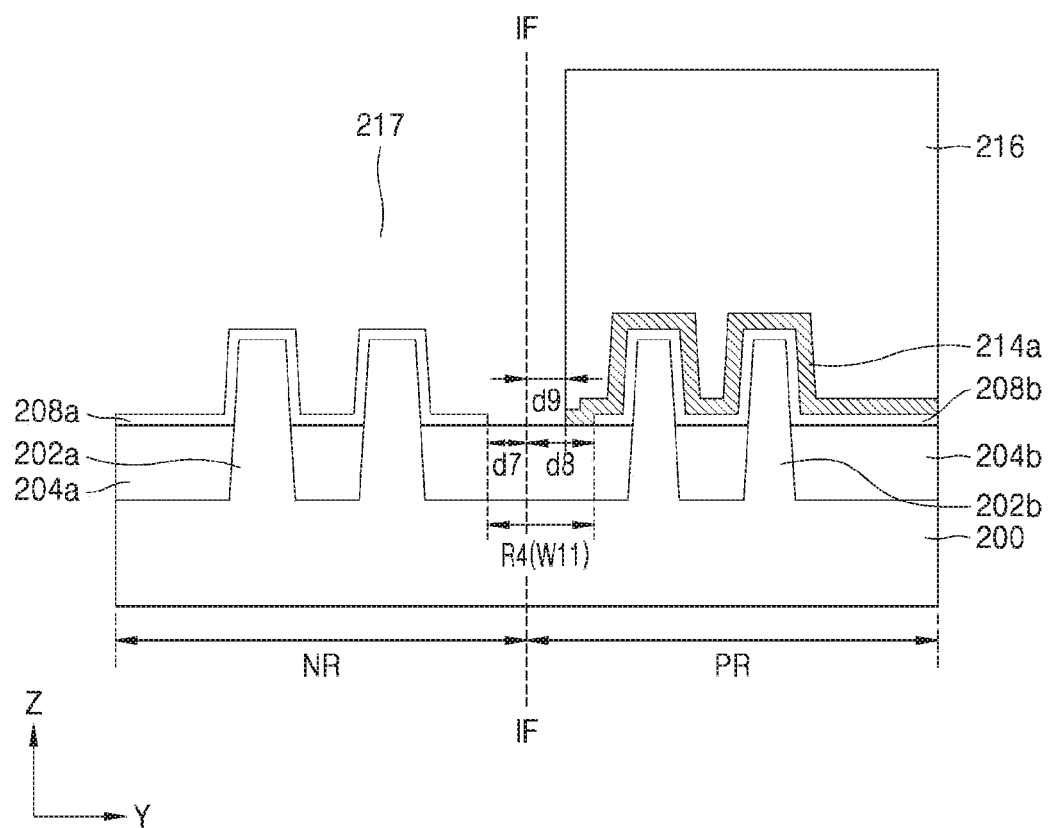
Figure 12E:
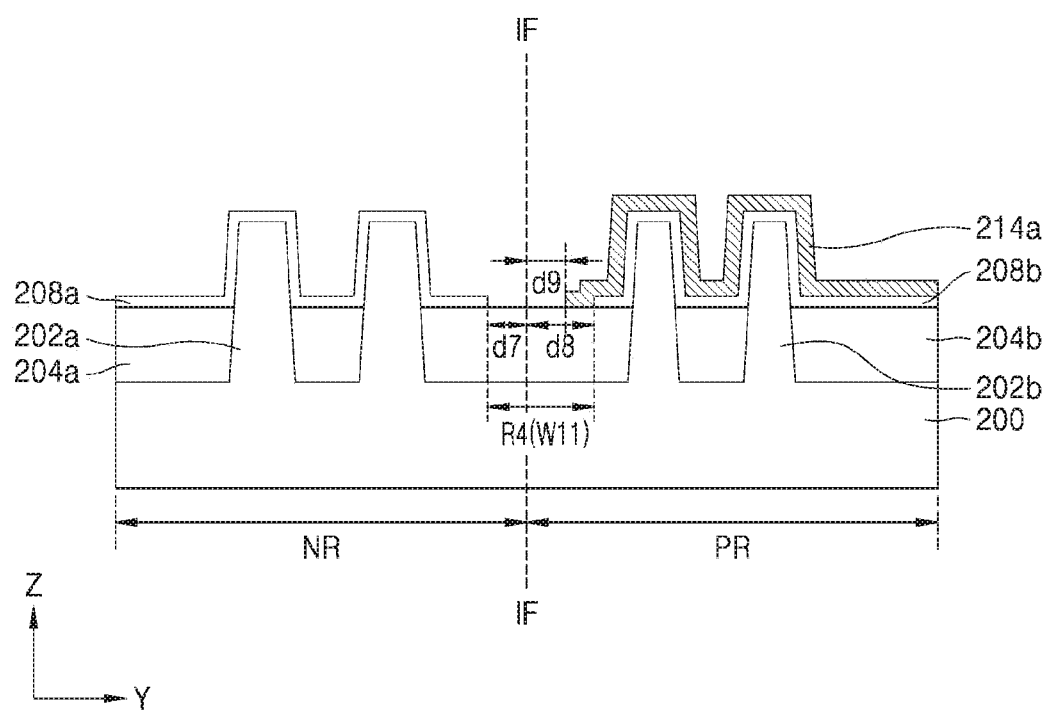

Referring to FIGS. 12D and 12E, a second mask pattern 216 may be formed, the second mask pattern 216 having a second opening 217 exposing all of the first region NR and a portion of the threshold voltage adjustment material layer 214 of the second region PR, as shown in FIG. 12D. A distance of the second opening 217 from the boundary IF to the second mask pattern 216 may be d9. The threshold voltage adjustment layer 214a may be formed in the second region PR by etching a portion of the threshold voltage adjustment material layer 214 in FIG. 12C by using the second mask pattern 216 as an etch mask.

As shown in FIG. 12E, the second mask pattern 216 may be removed. In this case, the distance from the boundary line IF to one end of the threshold voltage adjustment layer 214a in the second region PR may be d9. As shown in FIG. 8, the first gate electrode 218a and the second gate electrode 218b may be each formed on the first region NR and the second region PR.

Figure 13A:
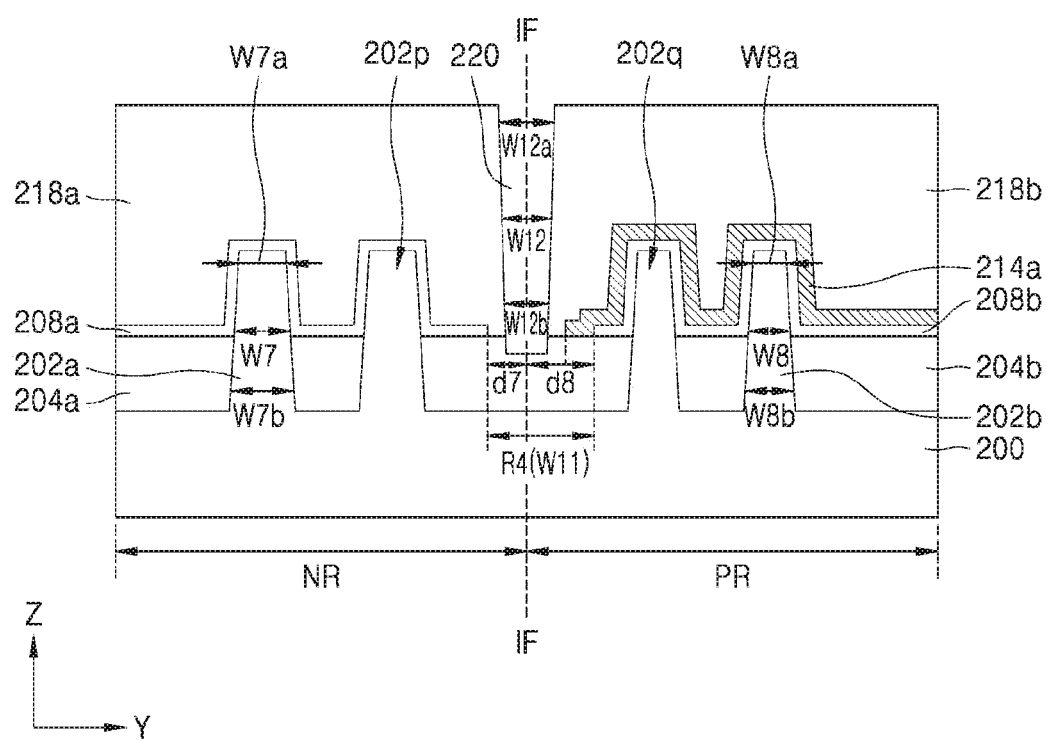
FIGS. 13A and 13B are cross-sectional views for explaining a method of manufacturing the integrated circuit semiconductor device of FIG. 9.
Figure 13B:
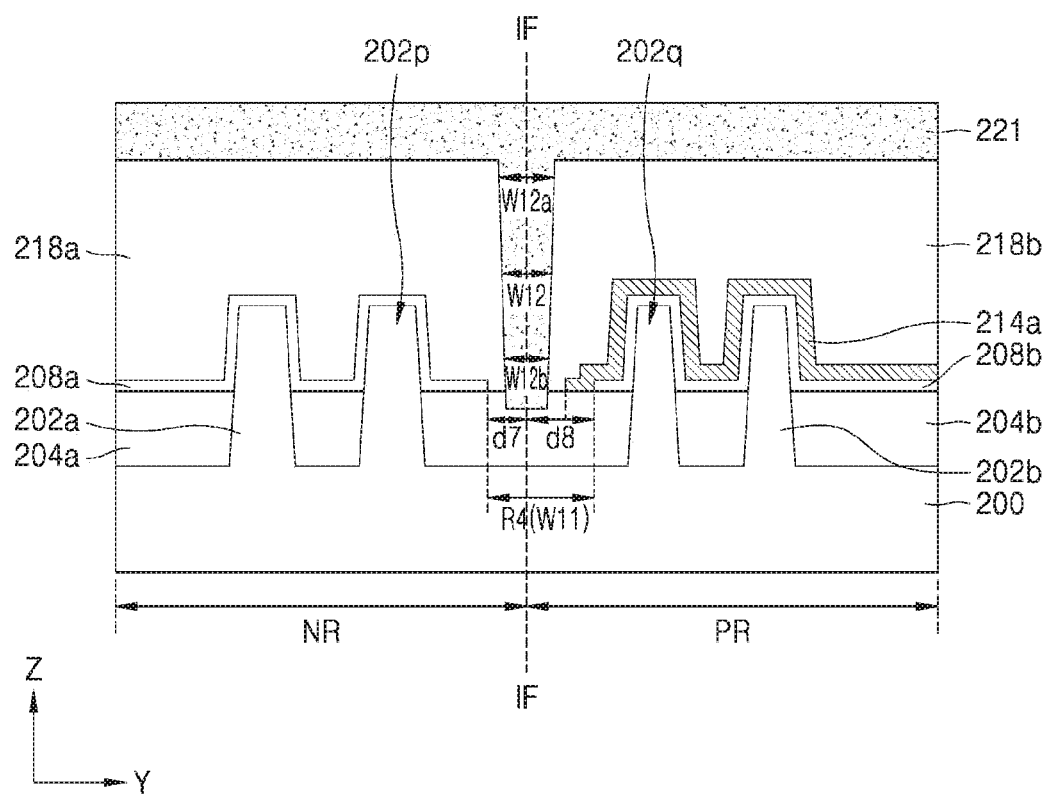

FIGS. 13A and 13B are cross-sectional views for explaining a method of manufacturing the integrated circuit semiconductor device of FIG. 9.

Specifically, in FIGS. 13A and 13B, the same reference numerals as in FIGS. 7 to 9 and FIGS. 12A to 12E denote the same elements. In FIGS. 13A and 13B, the same contents as those in FIGS. 7 to 9 and FIGS. 12A to 12E may be briefly described or omitted.

As described above with reference to FIGS. 8 and 12A to 12E, the first gate electrode 218a and the second gate electrode 218b may be formed on the first region NR and the second region PR, respectively. As shown in FIG. 8, the first gate electrode 218a and the second gate electrode 218b may be connected to each other.

Then, as shown in FIG. 13A, a third opening 220 may be formed through the first gate electrode 218a and the second gate electrode 218b in the vicinity of the boundary line IF of the first region NR and the second region PR. Since the third opening 220 may be formed in the first gate dielectric layer removal region R4, the third opening 220 may be more easily formed.

In addition, since the third opening 220 may be formed in a region where a gate dielectric layer is removed, the third opening 220 may be more easily formed without excessively damaging an interlayer insulating layer (not shown) formed around the first gate electrode 218a and the second gate electrode 218b.

The width of the third opening 220 in the second direction may be W12. One side wall of the third opening 220 may be inclined from the upper surfaces of the first gate electrode 218a and the second gate electrode 218b toward the bottom surfaces thereof. In some embodiments, the bottom width W12b of the third opening 220 may be less than the top or upper width W12a. The first gate electrode 218a and the second gate electrode 218b may be separated by the third opening 220.

As shown in FIG. 13B, a gate cut material layer 221 may be formed on the first gate electrode 218a and the second gate electrode 218b while filling the third opening 220. The gate cut material layer 221 may be then planarized to form the gate cut pattern 222 as shown in FIG. 9.

The gate cut pattern 222 may define the first gate cut region CT4 as shown in FIG. 9. The first gate electrode 218a and the second gate electrode 218b may be electrically separated by the gate cut pattern 222 defining the first gate cut region CT4.

Figure 14:
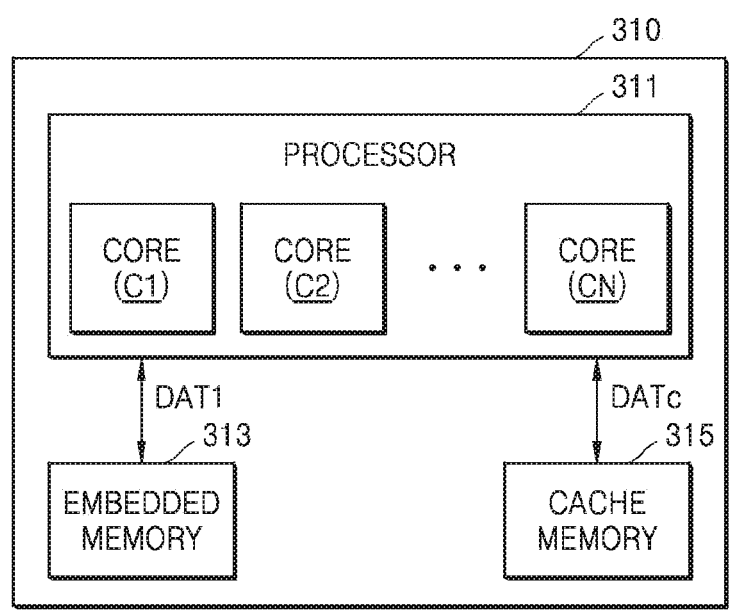
FIG. 14 is a block diagram illustrating the configuration of an electronic device including an integrated circuit semiconductor device according to embodiments of the inventive concepts.

FIG. 14 is a block diagram illustrating the configuration of an electronic device including an integrated circuit semiconductor device according to embodiments of the inventive concepts.

Specifically, the electronic device 300 may include a semiconductor chip 310. The semiconductor chip 310 may include a processor 311, an embedded memory 313, and a cache memory 315. The processor 311 may include one or more processor cores C1-Cn. The processor cores C1-Cn may process data and signals. The processor cores C1-Cn may include integrated circuit semiconductor devices according to embodiments of the inventive concepts.

The electronic device 300 may perform its own functions by using the processed data and signals. In one example, the processor 311 may include an application processor. The embedded memory 313 may exchange first data DAT1 with the processor 311. The first data DAT1 may be data processed or to be processed by the processor cores C1-Cn. The embedded memory 313 may manage the first data DAT1. For example, the embedded memory 313 may buffer the first data DAT1. The embedded memory 313 may operate as a buffer memory or a working memory of the processor 311.

The embedded memory 313 may include a static random access memory (SRAM). The SRAM may operate faster than a dynamic random access memory (DRAM). When the SRAM is embedded in the semiconductor chip 310, the electronic device 300 having a small size and operating at a high speed may be realized. Further, when the SRAM is embedded in the semiconductor chip 310, the consumption of the active power of the electronic device 300 may be reduced.

In one example, the SRAM may include integrated circuit semiconductor devices according to embodiments of the inventive concepts. The cache memory 315 may be mounted on the semiconductor chip 310 together with the processor cores C1-Cn. The cache memory 315 may store cache data DATc. The cache data DATc may include data used by the processor cores C1-Cn. The cache memory 315 may have relatively smaller storage capacity, but may operate at relatively higher speed.

For example, the cache memory 315 may include the SRAM including an integrated circuit semiconductor device according to embodiments of the inventive concepts. When the cache memory 315 is used, the number of times the processor 311 accesses the embedded memory 313 and the duration of time during which the processor 311 accesses the embedded memory 313 may be reduced. Therefore, when the cache memory 315 is used, the operation speed of the electronic device 300 may be increased.

In FIG. 14, the cache memory 315 is shown as a separate component from the processor 311, for ease of understanding. However, the cache memory 315 may be configured to be included in the processor 311.

Figure 15:
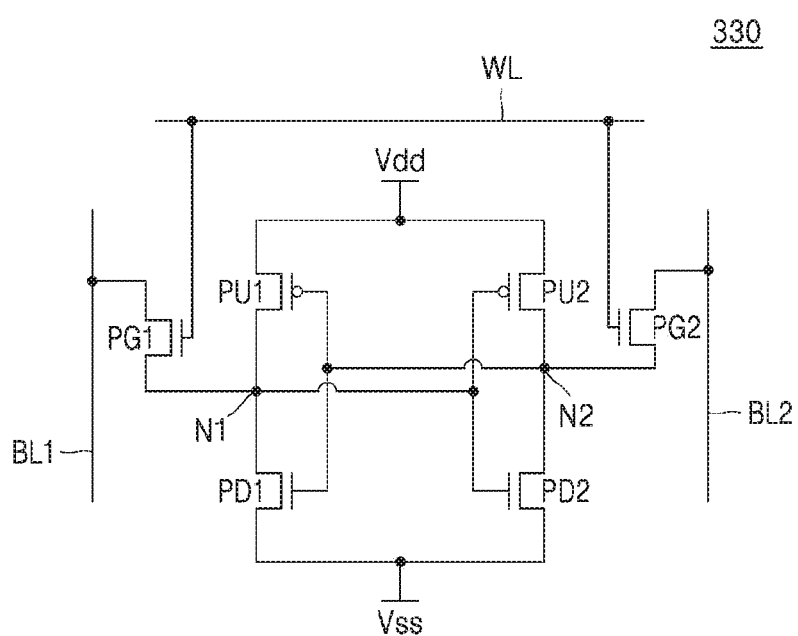
FIG. 15 is an equivalent circuit diagram of a static random access memory (SRAM) cell according to some embodiments of the inventive concepts.

FIG. 15 is an equivalent circuit diagram of an SRAM cell according to some embodiments of the inventive concepts.

Specifically, the SRAM cell 330 may be implemented by using the integrated circuit semiconductor devices 10 to 60 according to some embodiments of the inventive concepts.

For example, the SRAM cell 330 may be provided as the embedded memory 313 and/or the cache memory 315 described in FIG. 14.

The SRAM cell 330 may include a first pull-up transistor PU1, a first pull-down transistor PD1, a second pull-up transistor PU2, a second pull-down transistor PD2, a first access transistor PG1, and a second access transistor PG2.

The first and second pull-up transistors PU1 and PU2 may be P-type MOS transistors while the first and second pull-down transistors PD1 and PD2 and the first and second access transistors PG1 and PG2 may be N-type MOS transistors.

The first pull-up transistor PU1 and the first pull-down transistor PD1 may constitute a first inverter. The gate electrodes (gates) of the first pull-up and first pull-down transistors PU1 and PD1, the gate electrodes (gates) being connected to each other, may correspond to an input terminal of the first inverter, and a first node N1 may correspond to an output terminal of the first inverter.

The second pull-up transistor PU2 and the second pull-down transistor PD2 may constitute a second inverter. The gate electrodes (gates) connected to each other of the second pull-up and second pull-down transistors PU2 and PD2 may correspond to an input terminal of the second inverter and a second node N2 may correspond to an output terminal of the second inverter.

The first and second inverters may be combined to constitute a latch structure. The gates of the first pull-up and first pull-down transistors PU1 and PD1 may be electrically connected to the second node N2 and the gates of the second pull-up and second pull-down transistors PU2 and PD2 may be electrically connected to the first node N1. A second source/drain of the first pull-up transistor PU1 and the second pull-up transistor PU2 may be connected to a power supply voltage Vdd. A second source/drain of the first pull-down transistor PD1 and the second pull-down transistor PD2 may be connected to a ground voltage Vss.

A first source/drain of the first access transistor PG1 may be connected to the first node N1 and a second source/drain of the first access transistor PG1 may be connected to a first bit line BL1. A first source/drain of the second access transistor PG2 may be connected to the second node N2 and a second source/drain of the second access transistor PG2 may be connected to a second bit line BL2. The gates of the first and second access transistors PG1 and PG2 may be electrically connected to a word line WL.

Figure 16:
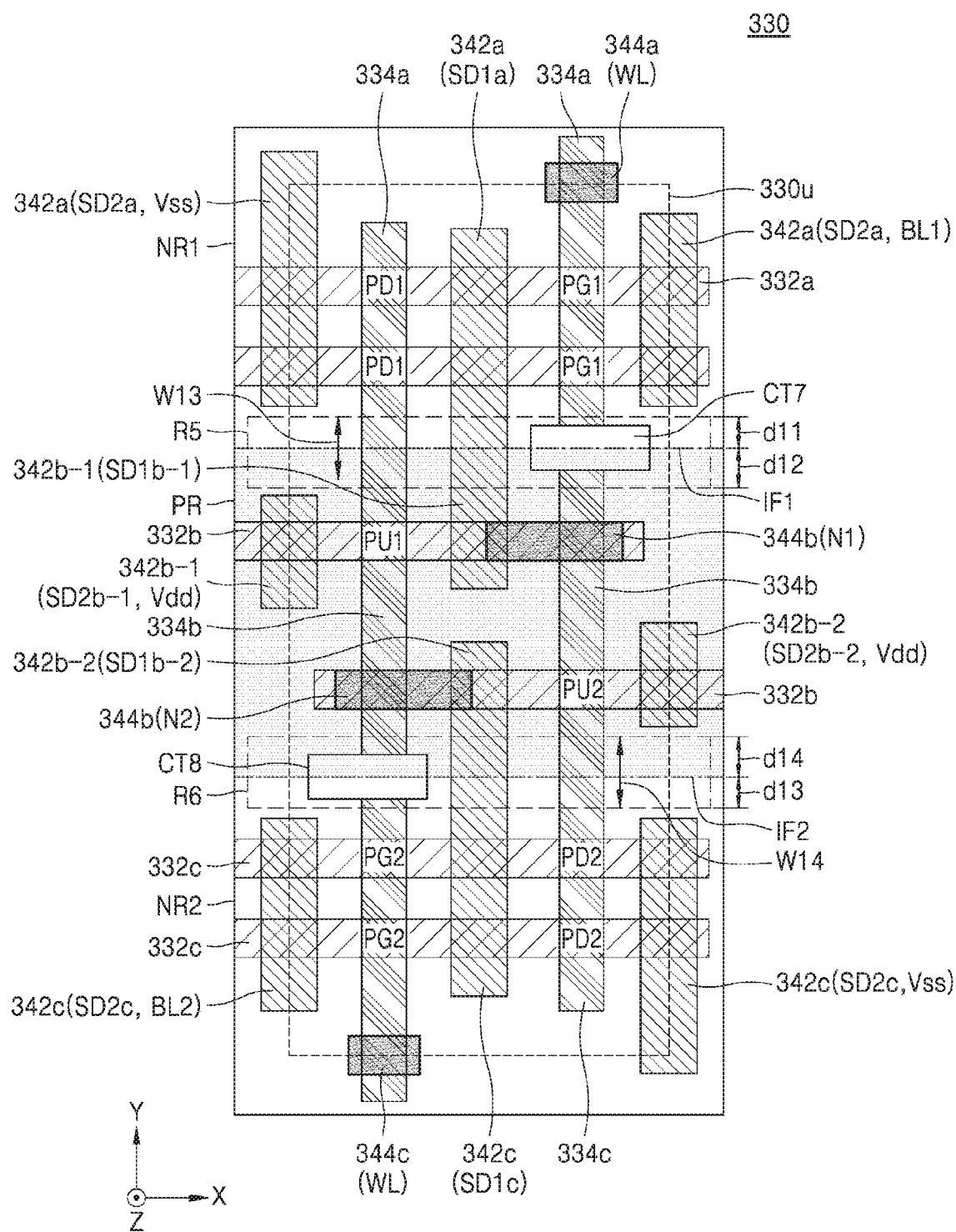
FIG. 16 is a layout diagram illustrating some embodiments of the SRAM cell of FIG. 15.

FIG. 16 is a layout diagram of some embodiments of the SRAM cell of FIG. 15.

Specifically, FIG. 16 may show some embodiments, according to which the SRAM cell 330 of FIG. 15 is realized. The SRAM cell 330 of FIG. 16 may be realized by using the integrated circuit semiconductor devices 10, 20, 40, and/or 60 according to embodiments of the inventive concepts. The SRAM cell 330 may include a unit SRAM cell 330u.

In FIG. 16, a first direction (an X direction) may be a channel length direction, and a second direction (a Y direction) may be a channel width direction. The SRAM cell 330 may include a first region NR1, a second region PR, and a third region NR2. The first region NR1 and the third region NR2 may be positioned above and below the second region PR in the second direction (the Y direction), respectively. The first region NR1 and the third region NR2 may correspond to the first region NR of FIGS. 1 and 7. The second region PR may correspond to the second region PR of FIGS. 1 and 7.

The first region NR1 and the third region NR2 may include the first and third transistors, for example, the N-type MOS transistors. The first region NR1 may include the first pull-down transistor PD1 and the first access transistor PG1 as the first transistor. The third region NR2 may include the second pull-down transistor PD2 and the second access transistor PG2 as the third transistor. In some embodiments, the first pull-down transistor PD1, the first access transistor PG1, the second pull-down transistor PD2, and the second access transistor PG2 may include a multi-bridge channel type transistor or a fin type transistor.

The second region PR may include the second transistor, for example, a P-type MOS transistor. The second region PR may include the first pull-up transistor PU1 and the second pull-up transistor PU2 as the second transistor. The first pull-up transistor PU1 and the second pull-up transistor PU2 may be the multi-bridge channel type transistor or the fin type transistor.

The first pull-down transistor PD1 and the first access transistor PG1 may each include two first active fins 332a extending in the first direction (the X direction). Although the first pull-down transistor PD1 and the first access transistor PG1 are illustrated as having two first active fins 332a, the inventive concepts is not limited thereto. The first pull-down transistor PD1 and the first access transistor PG1 may each include a first gate electrode 334a extending in the second direction (the Y direction).

The first pull-down transistor PD1 and the first access transistor PG1 may include a first active contact pattern 342a (a source/drain contact pattern). The first active contact pattern 342a may include a first source/drain SD1a and a second source/drain SD2a. The second source/drain SD2a of the first pull-down transistor PD1 may be connected to the ground voltage Vss and the second source/drain SD2a of the first access transistor PG1 may be connected to the first bit line BL1. A first metal contact pattern 344a connected to the word line WL may be formed in the first gate electrode 334a in the first access transistor PG1.

The second pull-down transistor PD2 and the second access transistor PG2 may each include two third active fins 332c extending in the first direction (the X direction). Although the second pull-down transistor PD2 and the second access transistor PG2 are illustrated as having two third active fins 332c, the inventive concepts is not limited thereto. The second pull-down transistor PD2 and the second access transistor PG2 may each include a third gate electrode 334c extending in the second direction (Y direction).

The second pull-down transistor PD2 and the second access transistor PG2 may include a third active contact pattern 342c (the source/drain contact pattern). The third active contact pattern 342c may include a first source/drain SD1c and second source/drain SD2c. The second source/drain SD2c of the second pull-down transistor PD2 may be connected to the ground voltage Vss and the second source/drain SD2c of the second access transistor PG2 may be connected to the second bit line BL2. A fourth metal contact pattern 344c connected to the word line WL may be formed on the third gate electrode 334c in the second access transistor PG2.

The first pull-up transistor PU1 and the second pull-up transistor PU2 may each have one second active fin 332b extending in the first direction (the X direction). Although the first pull-up transistor PU1 and the second pull-up transistor PU2 each have one second active fin 332b, the inventive concepts is not limited thereto. The first pull-up transistor PU1 and the second pull-up transistor PU2 may each include a second gate electrode 334b extending in the second direction (the Y direction).

The first pull-up transistor PU1 may include a second active contact pattern 342b-1 (the source/drain contact pattern). The second active contact pattern 342b-1 may include a first source/drain SD1b-1 and a second source/drain SD2b-1. The first source/drain SD1b-1 may be connected to the first source/drain SD1a of the first pull-down transistor PD1 and the first access transistor PG1. The first source/drain may be connected to the first node N1 through the second metal contact pattern 344b. The second source/drain SD2b-1 may be connected to the power supply voltage Vdd.

The second pull-up transistor PU2 may include the third active contact pattern 342b-2 (the source/drain contact pattern). The third active contact pattern 342b-2 may include the first source/drain SD1b-2 and the second source/drain SD2b-2. The first source/drain SD1b-2 may be connected to the first source/drain SD1c of the first pull-down transistor PD2 and the second access transistor PG2. The first source/drain SD1b-2 may be connected to the first node N2 through the second metal contact pattern 344b. The second source/drain SD2b-2 may be connected to the power supply voltage Vdd.

A first boundary, for example a first boundary line IF1, extending in the first direction (the X direction) may be defined at the interface between the first region NR1 and the second region PR. The threshold voltages of the first pull-down transistor PD1, the first access transistor PG1 and the first pull-up transistor PU1 may deviate from the designed values depending on the distances from the first boundary line IF1 due to the metal gate boundary effect described above. Thus, the first gate dielectric layer removal region R5, from which the gate dielectric layer is removed, may be formed in the vicinity of or proximate the first boundary line IF1 between the first region NR1 and the second region PR.

A second boundary, for example a second boundary line IF2, extending in the first direction (the X direction) may be defined at the interface between the second region PR and the third region NR2. The threshold voltages of the second pull-down transistor PD2, the second access transistor PG2 and the second pull-up transistor PU2 may deviate from the designed values depending on the distances from the second boundary line IF2 due to the metal gate boundary effect described above. Thus, the second gate dielectric layer removal region R6, from which the gate dielectric layer is removed, may be formed in the vicinity of or proximate the second boundary line IF2 between the second region PR and the third region NR2.

The first gate dielectric layer removal region R5 may be disposed to be shifted to or offset toward either the first region NR1 or the second region PR in the second direction with respect to the first boundary line IF1. In some embodiments, a width in the second direction of the first gate dielectric layer removal region R5 may be W13. Edges of the first gate dielectric layer removal region R5 may have respective distances d11 and d12 from the first boundary line IF1 toward the first region NR1 and the second region PR, respectively, in the second direction, where the distance d12 may be greater than the distance d11.

The second gate dielectric layer removal region R6 may be disposed to be shifted to or offset toward either the second region PR or the third region NR2 in the second direction with respect to the second boundary line IF2. In some embodiments, a width in the second direction of the second gate dielectric layer removal region R6 may be W14. Edges of the second gate dielectric layer removal region R6 may have respective distances d13 and d14 from the second boundary line IF2 toward the third region NR2 and the second region PR, respectively, in the second direction, where the distance d14 may be greater than the distance d13.

In addition, the first gate cut region CT7, in which the first gate electrode 334a of the first access transistor PG1 and the second gate electrode 334b of the second pull-up transistor PU2 are cut or separated in the second direction, may be located in the first gate dielectric layer removal region R5 The first gate cut region CT7 may be more easily formed in the first gate dielectric layer removal region R5.

In addition, the second gate cut region CT8, in which the third gate electrode 334c of the second access transistor PG2 and the second gate electrode 334b of the first pull-up transistor PU1 are cut or separated in the second direction, may be located in the second gate dielectric layer removal region R6 The second gate cut region CT8 may be more easily formed in the second gate dielectric layer removal region R6.

In addition, the widths of the first active fin 332a, the second active fin 332b, and the third active fin 332c in the Y direction may be the same as or different from one another. Further, the widths of the active fins 332a and 332b of the first region NR1 and the second region PR which are separated from each other due to the first gate cut region CT7, the widths being in the Y direction, may be the same as or different from each other. Also, the widths of the active fins 332b and 332c of the second region PR and the third region NR2 which are separated from each other due to the second gate cut region CT8, the widths being in the Y direction, may be the same as or different from each other.

The integrated circuit semiconductor device according to the inventive concepts include the gate dielectric layer removal region where the gate dielectric layer is removed, in the vicinity of the boundary line of the first region including the first transistors and the second region including the second transistors. The gate dielectric layer removal region may be disposed to be inclined to or offset toward either the first region or the second region based on the boundary line, or may be disposed in any one of the first region or the second region.

Accordingly, the first transistors and the second transistors may be reliably formed in the integrated circuit semiconductor device of the inventive concepts, by preventing the metal gate boundary effect in which the threshold voltages of the first transistors and the threshold voltages of the second transistors TR2 are deviated from the design value.

While the inventive concepts have been particularly shown and described with reference to embodiments thereof, it will be understood that various changes in form and details may be made therein without departing from the spirit and scope of the following claims.

What is claimed is:

1. An integrated circuit semiconductor device comprising:
a first region comprising a first transistor, wherein the first transistor comprises a first active fin extending in a first direction, a first gate dielectric layer extending from the first active fin onto a first isolation layer in a second direction perpendicular to the first direction, and a first gate electrode on the first gate dielectric layer;
a second region in contact with the first region in the second direction, wherein the second region comprises a second transistor, the second transistor comprising a second active fin extending in the first direction, a second gate dielectric layer extending from the second active fin onto a second isolation layer in the second direction, and a second gate electrode on the second gate dielectric layer, wherein the first and second regions are logic cell or memory cell regions; and a gate dielectric layer removal region proximate a boundary between the first region and the second region, wherein the gate dielectric layer removal region is offset toward either the first region or the second region in the second direction with respect to the boundary, wherein the first and second gate dielectric layers extend toward the boundary by different first and second lengths, respectively, in the second direction.

2. The integrated circuit semiconductor device of claim 1, wherein the gate dielectric layer removal region separates the first and second gate dielectric layers such that respective distances from the boundary to the first gate dielectric layer and from the boundary to the second gate dielectric layer are different from each other, and wherein the first and second gate electrodes are in direct contact along the boundary.

3. The integrated circuit semiconductor device of claim 1, wherein a first width of the first active fin in the second direction is different from a second width of the second active fin in the second direction.

4. The integrated circuit semiconductor device of claim 1, wherein
a first channel width of the first transistor in the second direction is different from a second channel width of the second transistor in the second direction.

5. The integrated circuit semiconductor device of claim 1, further comprising:
a first threshold voltage adjustment layer on the second gate dielectric layer and extending along a surface of the second gate dielectric layer,
wherein the first threshold voltage adjustment layer is not connected to the first gate dielectric layer, and
wherein a portion of the gate dielectric layer removal region is between the first threshold voltage adjustment layer and the first gate dielectric layer.

6. The integrated circuit semiconductor device of claim 5, further comprising:
a second threshold voltage adjustment layer on the first gate dielectric layer and extending along a surface of the first gate dielectric layer,
wherein the second threshold voltage adjustment layer is not connected to the second gate dielectric layer, and
wherein the portion of the gate dielectric layer removal region is between the second threshold voltage adjustment layer and the second gate dielectric layer.

7. The integrated circuit semiconductor device of claim 1, further comprising:
a gate cut region that separates the first gate electrode from the second gate electrode in the second direction, wherein the gate cut region is on the gate dielectric layer removal region.

8. The integrated circuit semiconductor device of claim 7, wherein a gate cut pattern defining the gate cut region comprises a side wall extending in a third direction that is perpendicular to the first and second directions, wherein the side wall is inclined from a lower portion thereof toward an upper portion thereof, and a lower width of the gate cut pattern is less than an upper width thereof.

9. The integrated circuit semiconductor device of claim 1, wherein the boundary is defined along an interface between the first and second regions of different conductivity types, and wherein the first transistor is an N-type transistor and the second transistor is a P-type transistor.

10. The integrated circuit semiconductor device of claim 1, wherein the first active fin comprises a first fin protrusion portion protruding from a first surface of the first isolation layer and the second active fin comprises a second fin protrusion portion protruding from a second surface of the second isolation layer.

11. An integrated circuit semiconductor device comprising:
a first region comprising a first multi-bridge channel type transistor, wherein the first multi-bridge channel type transistor comprises a first active fin protruding from a substrate and extending in a first direction, a first gate dielectric layer extending from the first active fin onto a first isolation layer in a second direction perpendicular to the first direction, a plurality of first nanosheets stacked apart from the first gate dielectric layer, a third gate dielectric layer on the first nanosheets, and a first gate electrode on the first gate dielectric layer and the third gate dielectric layer and between the first nanosheets;

a second region adjacent to the first region in the second direction, wherein the second region comprises a second multi-bridge channel type transistor, the second multi-bridge channel type transistor comprising a second active fin protruding from the substrate and extending in the first direction, a second gate dielectric layer extending from the second active fin onto a second isolation layer in the second direction perpendicular to the first direction, a plurality of second nanosheets stacked apart from the second gate dielectric layer, a fourth gate dielectric layer on the second nanosheets, and a second gate electrode on the second gate dielectric layer and the fourth gate dielectric layer and between the second nanosheets, wherein the first and second regions are logic cell or memory cell regions; and a gate dielectric layer removal region on the substrate proximate a boundary between the first region and the second region, wherein the gate dielectric layer removal region is offset toward either the first region or the second region in the second direction with respect to the boundary, wherein the first and second gate dielectric layers extend toward the boundary by different first and second lengths, respectively, in the second direction.

12. The integrated circuit semiconductor device of claim 11, wherein the gate dielectric layer removal region separates the first and second gate dielectric layers so that respective distances from the boundary to the first gate dielectric layer and from the boundary to the second gate dielectric layer are different from each other, and wherein the first and second gate electrodes are in direct contact along the boundary.

13. The integrated circuit semiconductor device of claim 11, wherein a first width of the first active fin in the second direction is different from a second width of the second active fin in the second direction, and a first channel width of the first multi-bridge channel type transistor in the second direction is different from a second channel width of the second multi-bridge channel type transistor in the second direction.

14. The integrated circuit semiconductor device of claim 11, further comprising:
a threshold voltage adjustment layer on the second gate dielectric layer and on the fourth gate dielectric layer surrounding the second nanosheets,
wherein the threshold voltage adjustment layer is not connected to the first gate dielectric layer, and wherein the gate dielectric layer removal region is between the threshold voltage adjustment layer and the first gate dielectric layer.

15. The integrated circuit semiconductor device of claim 11, further comprising
a gate cut region that separates the first gate electrode from the second gate electrode on the gate dielectric layer removal region,
wherein a gate cut pattern defining the gate cut region comprises a side wall extending in a third direction that is perpendicular to the first and second directions, wherein the side wall is inclined from a lower portion thereof toward an upper portion thereof, and a lower width of the gate cut pattern is less than an upper width thereof.

16. The integrated circuit semiconductor device of claim 11, wherein the boundary is defined along an interface between the first and second regions of different conductivity types, and wherein the first multi-bridge channel type transistor is an N-type transistor and the second multi-bridge channel type transistor is a P-type transistor.

17. An integrated circuit semiconductor device comprising:
a first region comprising a first fin type transistor, wherein the first fin type transistor comprises a first active fin protruding from a substrate and extending in a first direction, a first gate dielectric layer extending from the first active fin onto a first isolation layer in a second direction perpendicular to the first direction, and a first gate electrode on the first gate dielectric layer;
a second region in contact with the first region in the second direction, wherein the second region comprises a second fin type transistor, the second fin type transistor comprising a second active fin protruding from the substrate and extending in the first direction, a second gate dielectric layer extending from the second active fin onto a second isolation layer in the second direction, and a second gate electrode on the second gate dielectric layer, wherein the first and second regions are logic cell or memory cell regions; and
a gate dielectric layer removal region proximate a boundary between the first region and the second region,
wherein the gate dielectric layer removal region is offset toward either the first region or the second region in the second direction with respect to the boundary,
wherein the first and second gate dielectric layers extend toward the boundary by different first and second lengths, respectively, in the second direction.

18. The integrated circuit semiconductor device of claim 17, wherein the gate dielectric layer removal region separates the first and second gate dielectric layers so that respective distances from the boundary to the first gate dielectric layer and from the boundary to the second gate dielectric layer are different from each other, and wherein the first and second gate electrodes are in direct contact along the boundary.

19. The integrated circuit semiconductor device of claim 17, wherein a first width of the first active fin in the second direction is different from a second width of the second active fin in the second direction, and a first channel width of the first fin type transistor in the second direction is different from a second channel width of the second fin type transistor in the second direction.

20. The integrated circuit semiconductor device of claim 17, further comprising:
a first threshold voltage adjustment layer on the second gate dielectric layer and extending along a surface of the second gate dielectric layer, wherein the first threshold voltage adjustment layer is not connected to the first gate dielectric layer, and
a second threshold voltage adjustment layer on the first gate dielectric layer and extending along a surface of the first gate dielectric layer, wherein the second threshold voltage adjustment layer is not connected to the second gate dielectric layer,
wherein a portion of the gate dielectric layer removal region is between the first threshold voltage adjustment layer and the second threshold voltage adjustment layer.

* * * * *